(12) United States Patent
Dutta et al.

(10) Patent No.: US 7,839,687 B2
(45) Date of Patent: Nov. 23, 2010

(54) MULTI-PASS PROGRAMMING FOR MEMORY USING WORD LINE COUPLING

(75) Inventors: Deepanshu Dutta, Santa Clara, CA (US); Jeffrey W Lutze, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 189 days.

(21) Appl. No.: 12/252,727

(22) Filed: Oct. 16, 2008

(65) Prior Publication Data

US 2010/0097861 A1    Apr. 22, 2010

(51) Int. Cl.
G11C 16/04    (2006.01)

(52) U.S. Cl. .............. 365/185.17; 365/185.22; 365/185.24

(58) Field of Classification Search ............ 365/185.17, 365/185.22, 185.24
See application file for complete search history.

(56) References Cited

U.S. PATENT DOCUMENTS

| 6,134,140 | A  | * | 10/2000 | Tanaka et al. ......... | 365/185.03 |
| 6,661,707 | B2 |   | 12/2003 | Choi et al. | |
| 6,870,768 | B2 |   | 3/2005  | Cernea et al. | |
| 7,016,226 | B2 |   | 3/2006  | Shibata et al. | |
| 7,224,613 | B2 | * | 5/2007  | Chen et al. ............ | 365/185.22 |
| 7,355,889 | B2 |   | 4/2008  | Hemink et al. | |
| 7,652,929 | B2 | * | 1/2010  | Li ....................... | 365/185.24 |

| 2002/0034100 | A1 |   | 3/2002  | Sakui et al. | |
| 2006/0291292 | A1 |   | 12/2006 | Kwon et al. | |
| 2007/0297226 | A1 |   | 12/2007 | Mokhlesi | |
| 2008/0158949 | A1 |   | 7/2008  | Mui et al. | |
| 2008/0158973 | A1 |   | 7/2008  | Mui et al. | |
| 2008/0158985 | A1 |   | 7/2008  | Mokhlesi | |
| 2008/0198664 | A1 |   | 8/2008  | Mokhlesi | |
| 2010/0061151 | A1 | * | 3/2010  | Miwa et al. .......... | 365/185.17 |

FOREIGN PATENT DOCUMENTS

WO    2007143399 A2    12/2007

OTHER PUBLICATIONS

International Search Report and Written Opinion of the International Searching Authority dated Dec. 3, 2009 in PCT Application No. PCT/2009/057984.

* cited by examiner

Primary Examiner—Tuan T. Nguyen
(74) Attorney, Agent, or Firm—Vierra Magen Marcus & DeNiro LLP

(57) ABSTRACT

A multiple pass programming scheme is optimized using capacitive coupling in the word line to word line direction during program-verify operations. A different pass voltage is used in different programming passes on an adjacent word line of a selected word line which is being verified. In particular, a lower pass voltage can be used in a first pass than in a second pass. The programming process may involve a word line look ahead or zigzag sequence in which WLn is programmed in a first pass, followed by WLn+1 in a first pass, followed by WLn in a second pass, followed by WLn+1 in a second pass. An initial programming pass may be performed before the first pass in which storage elements are programmed to an intermediate state and/or to a highest state.

19 Claims, 19 Drawing Sheets

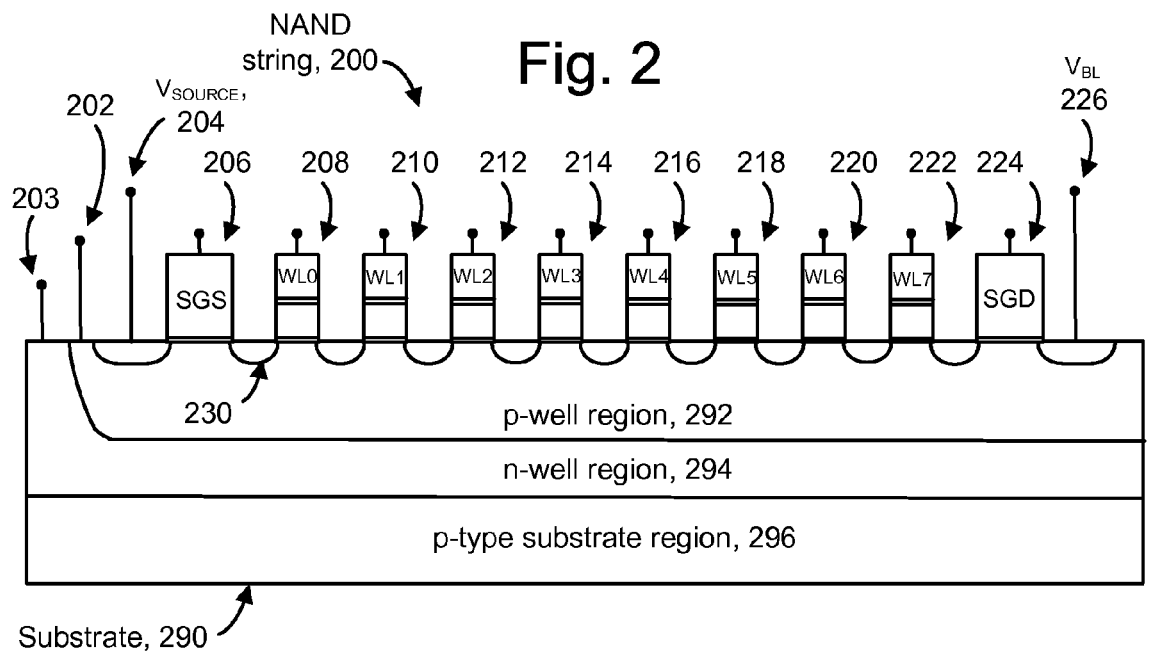
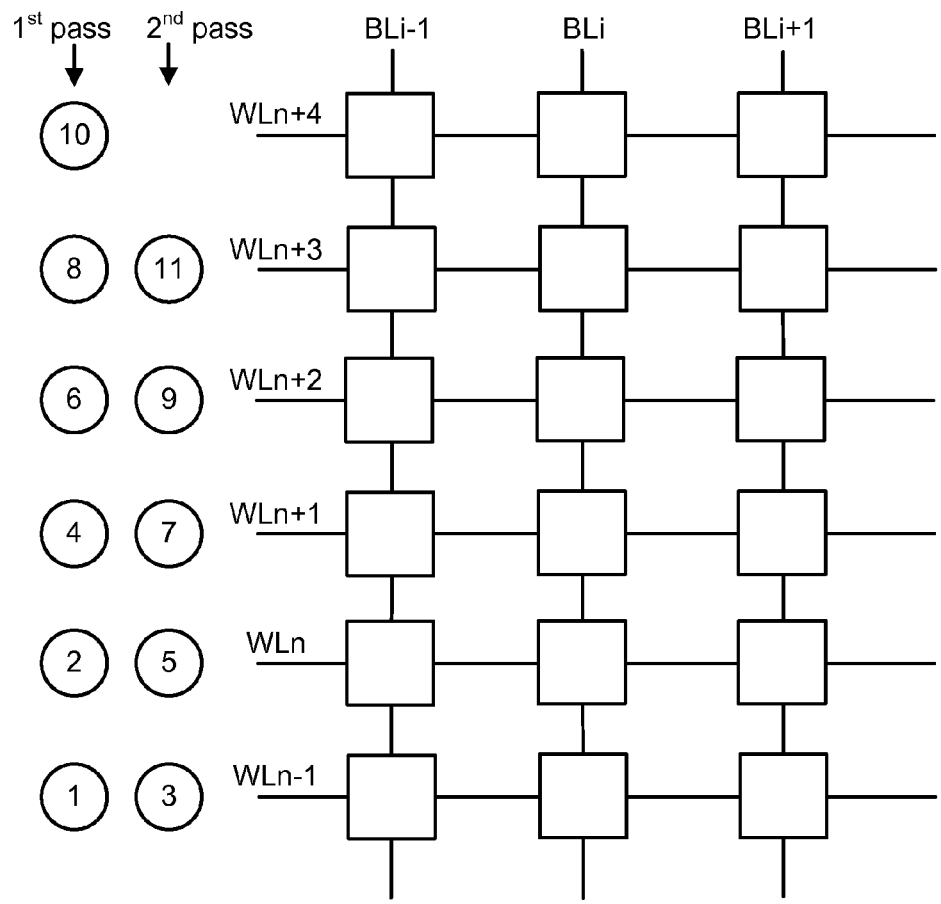

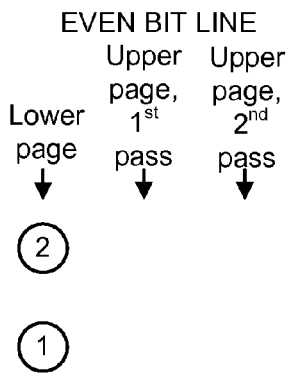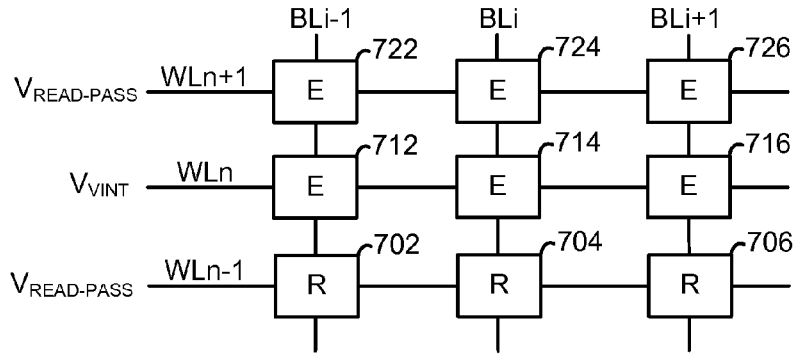
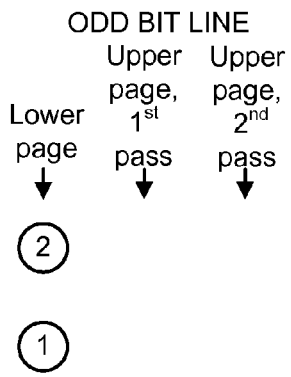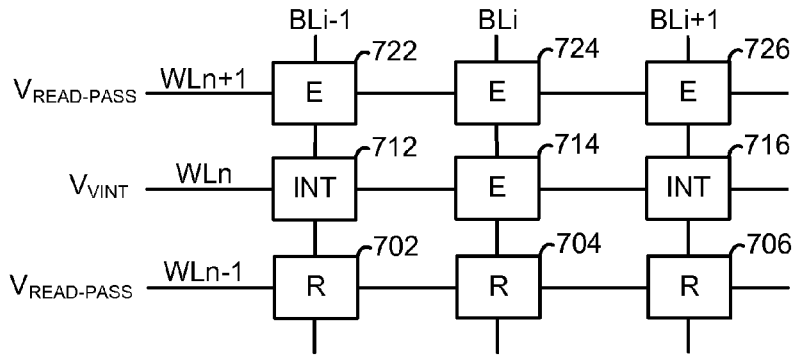
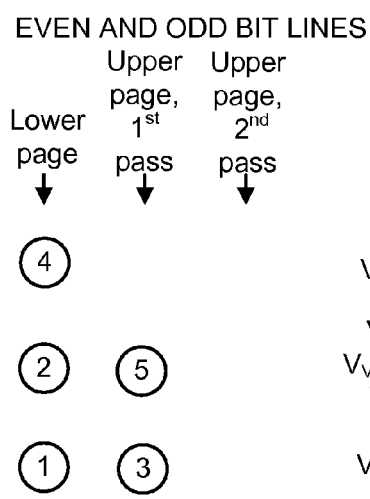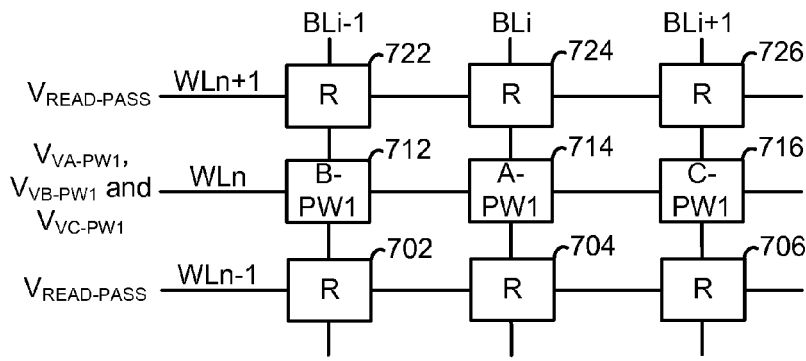

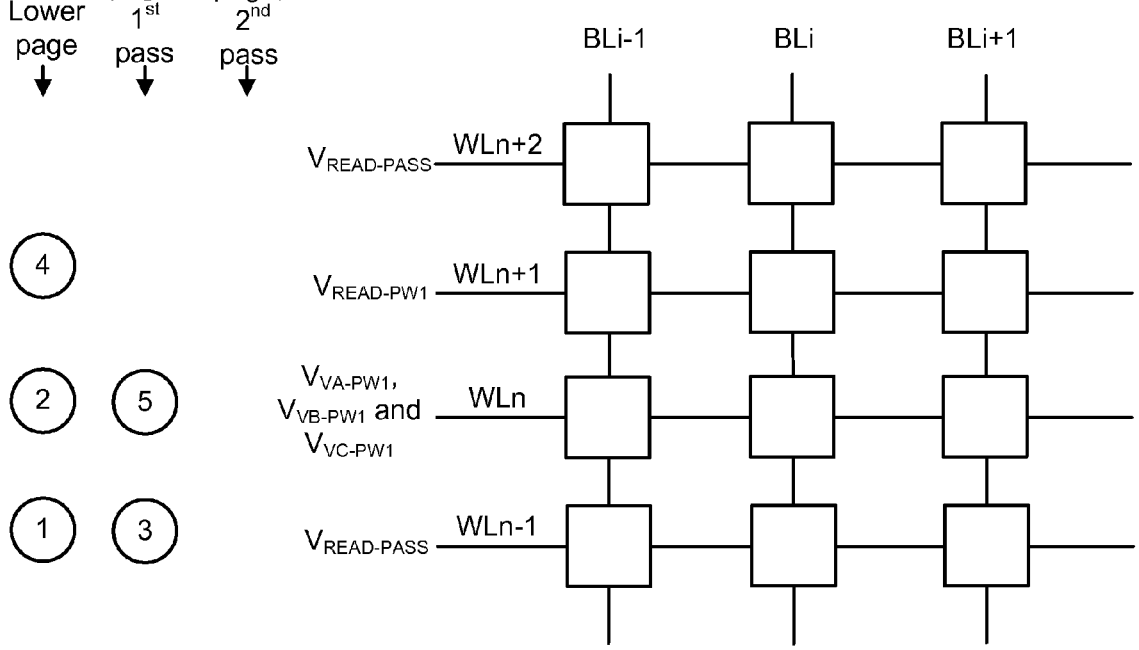
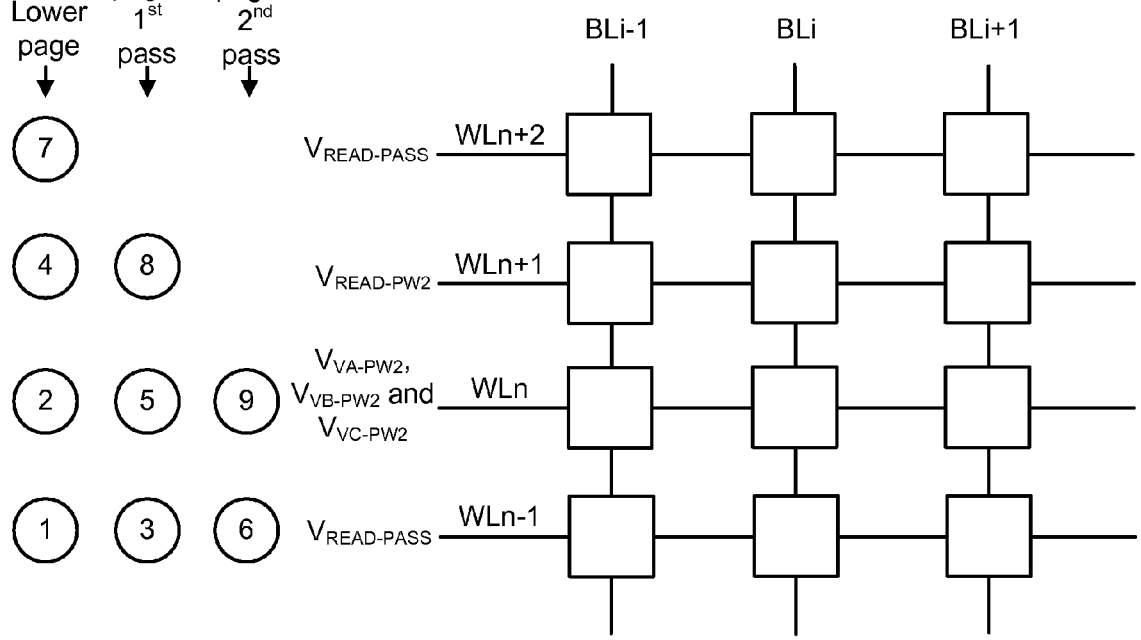

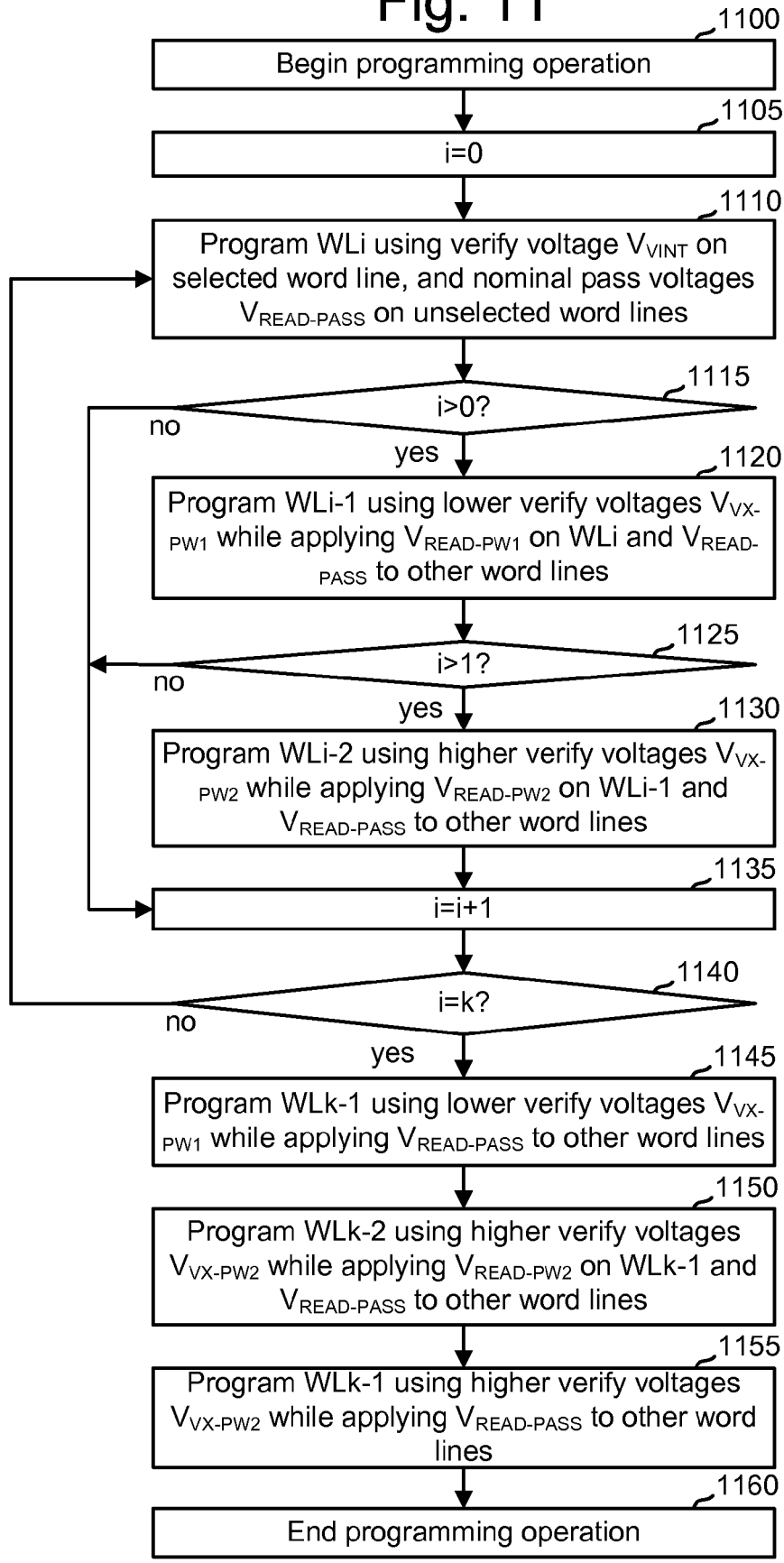

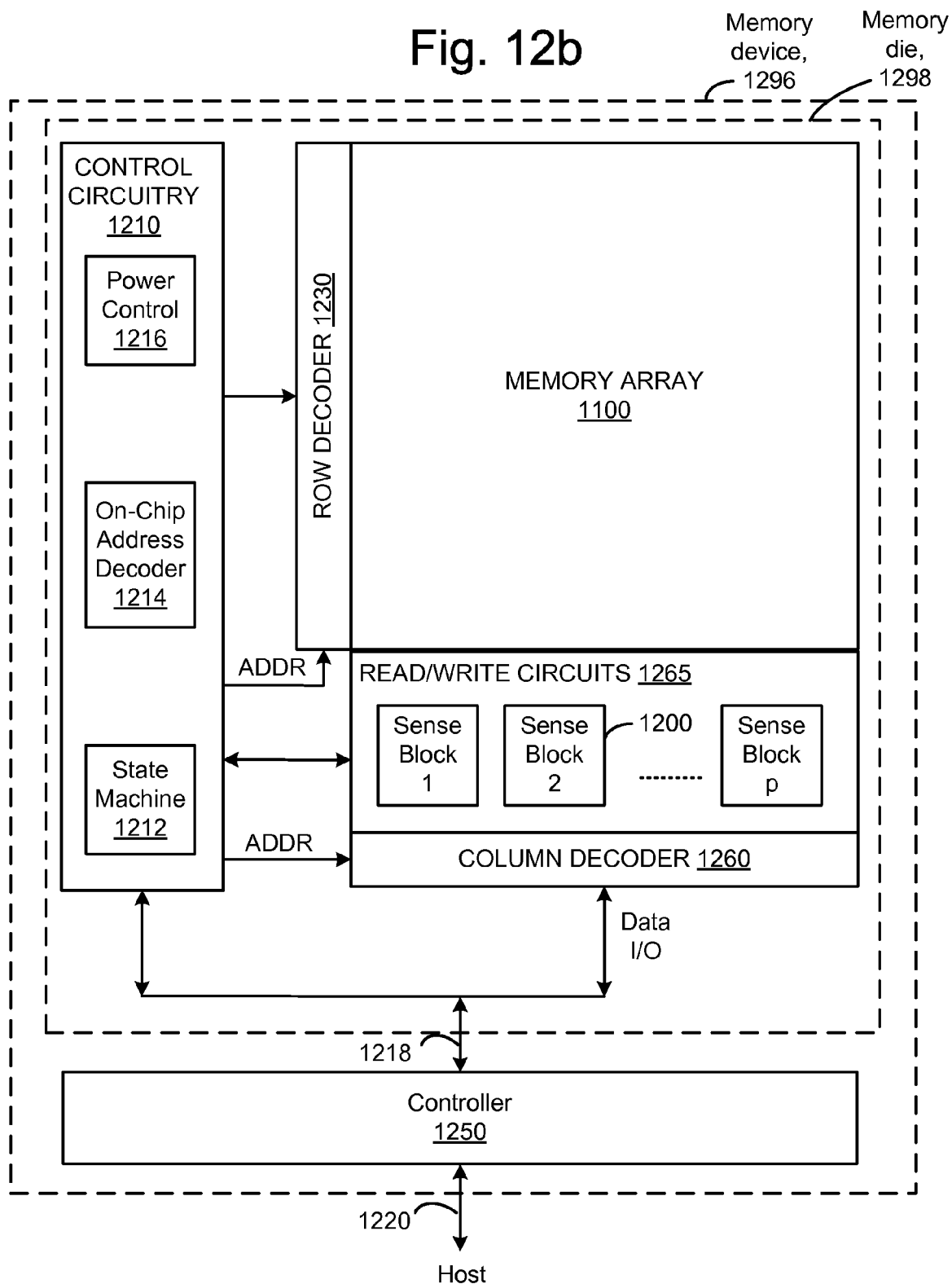

MULTI-PASS PROGRAMMING FOR MEMORY USING WORD LINE COUPLING

BACKGROUND OF THE INVENTION

1. Field of the Invention

The present invention relates to non-volatile memory.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{PGM}$ applied to the control gate during a program operation is applied as a series of pulses that increase in magnitude over time. In one possible approach, the magnitude of the pulses is increased with each successive pulse by a predetermined step size, e.g., 0.2-0.4 V. $V_{PGM}$ can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically $V_{PGM}$ is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state.

One issue which continues to be problematic is programming accuracy. The programming process must be accurate so that data can be read back with high fidelity. For example, multi-level devices which place threshold voltage ranges close together leave little room for error. Inaccuracies in programming a selected storage element can be caused by many variables, including the programmed data states of other, unselected storage elements which cause capacitive coupling. Accordingly, techniques which improve programming accuracy are needed.

SUMMARY OF THE INVENTION

The present invention addresses the above and other issues by providing a method for improving programming accuracy in non-volatile storage by compensating for capacitive coupling during a multi-pass programming process.

In one embodiment, a method for operating non-volatile storage includes performing program and verify operations on a particular storage element in a set of series-connected storage elements to raise a threshold voltage of the particular storage element to a first verify level, and during the verify operations, applying a first pass voltage to an adjacent storage element of the particular storage element in the set of series-connected storage elements. The method further includes subsequently performing program and verify operations on the adjacent storage element to raise a threshold voltage of the adjacent storage element. The method further includes subsequently performing further program and verify operations on the particular storage element to raise the threshold voltage of the particular storage element to a second verify level, above the first verify level, and during the further verify operations, applying a second pass voltage, which differs from the first pass voltage, to the adjacent storage element.

In another embodiment, a method for operating non-volatile storage includes performing one pass of a multi-pass programming process, including alternatingly programming and verifying a particular storage element in a set of series-connected storage elements, the verifying includes applying a first set of verify voltages to the particular storage element while applying a first pass voltage to an adjacent storage element of the particular storage element in the set of series-connected storage elements. The method further includes subsequently performing another pass of the multi-pass programming process, including alternatingly programming and verifying the particular storage element, the verifying of the another pass includes applying a second set of verify voltages to the particular storage element, the second set of verify voltages differs at least in part from the first set of verify voltages, while applying a second pass voltage, which differs from the first pass voltage, to the adjacent storage element.

In another embodiment, a method for operating non-volatile storage includes performing one pass of a multi-pass programming process, including applying a program voltage followed by a first set of verify voltages to a particular word line in a set of word lines, and applying a first pass voltage to an adjacent word line of the particular word line while applying the first set of verify voltages, the set of word lines communicates with a set of storage elements. The method further includes subsequently performing another pass of the multi-pass programming process, including applying the program voltage followed by a second set of verify voltages to the particular word line, and applying a second pass voltage to the adjacent word line while applying the second set of verify voltages, the second set of verify voltages differs at least in part from the first set of verify voltages.

In another embodiment, a non-volatile storage apparatus includes a set of storage elements and at least one control circuit. The at least one control circuit performs program and verify operations on a particular storage element in a set of series-connected storage elements to raise a threshold voltage of the particular storage element to a first verify level, and during the verify operations, applies a first pass voltage to an adjacent storage element of the particular storage element in the set of series-connected storage elements. The at least one control circuit subsequently performs program and verify operations on the adjacent storage element to raise a threshold voltage of the adjacent storage element. The at least one control circuit subsequently performs further program and verify operations on the particular storage element to raise the threshold voltage of the particular storage element to a second verify level, above the first verify level, and during the further verify operations, applies a second pass voltage, which differs from the first pass voltage, to the adjacent storage element.

Corresponding methods, systems and computer- or processor-readable storage devices which have executable code for performing the methods provided herein may also be provided.

BRIEF DESCRIPTION OF THE DRAWINGS

FIG. 1b is an equivalent circuit diagram of the NAND string of FIG. 1a.

FIG. 2 depicts a cross-sectional view of a NAND string.

FIG. 3 depicts a programming order for a set of storage elements and associated word lines.

FIGS. 7d-7h depict a set of storage elements during an even-odd programming operation.

FIG. 9c depicts a set of storage elements during a first programming pass on WLn, where a lower pass voltage is provided on WLn+1, as an alternative to FIG. 9a.

FIG. 9d depicts a set of storage elements during a second programming pass on WLn, where a higher pass voltage is provided on WLn+1, as an alternative to FIG. 9b.

FIG. 11 depicts an example programming process.

FIG. 12b is a block diagram of a non-volatile memory system using single row/column decoders and read/write circuits.

DETAILED DESCRIPTION

The present invention provides a method for improving programming accuracy in non-volatile storage by compensating for capacitive coupling during a multi-pass programming process.

Figure 1A:
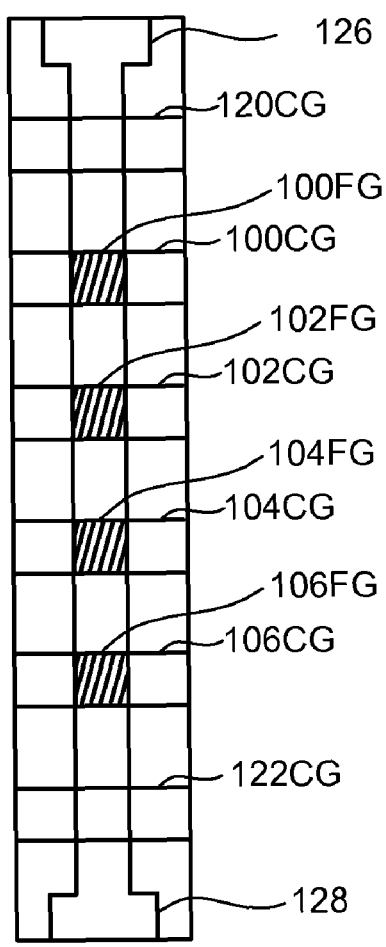
FIG. 1a is a top view of a NAND string.
Figure 1B:
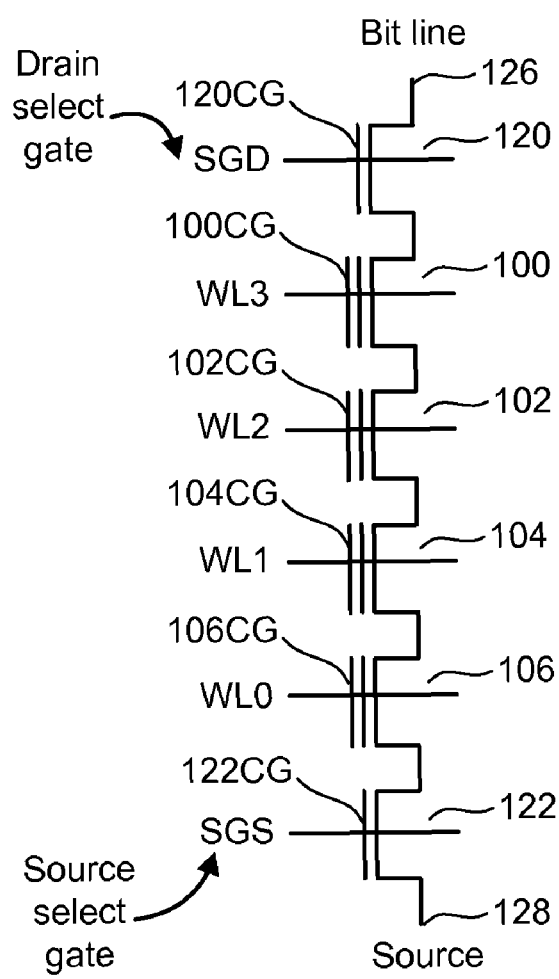

One example of a memory system suitable for implementing the present invention uses the NAND flash memory structure, which includes connecting multiple transistors in series between two select gates. The transistors connected in series and the select gates are referred to as a NAND string. FIG. 1a is a top view showing one NAND string. FIG. 1b is an equivalent circuit thereof. The NAND string includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to (or is) word line WL3, (where WL denotes "word line"), control gate 102CG is connected to WL2, control gate 104CG is connected to WL1, and control gate 106CG is connected to WL0. In one embodiment, transistors 100, 102, 104 and 106 are each storage elements, also referred to as memory cells. In other embodiments, the storage elements may include multiple transistors or may be different than depicted. Select gate 120 is connected to select line SGD. Select gate 122 is connected to select line SGS.

Figure 1C:
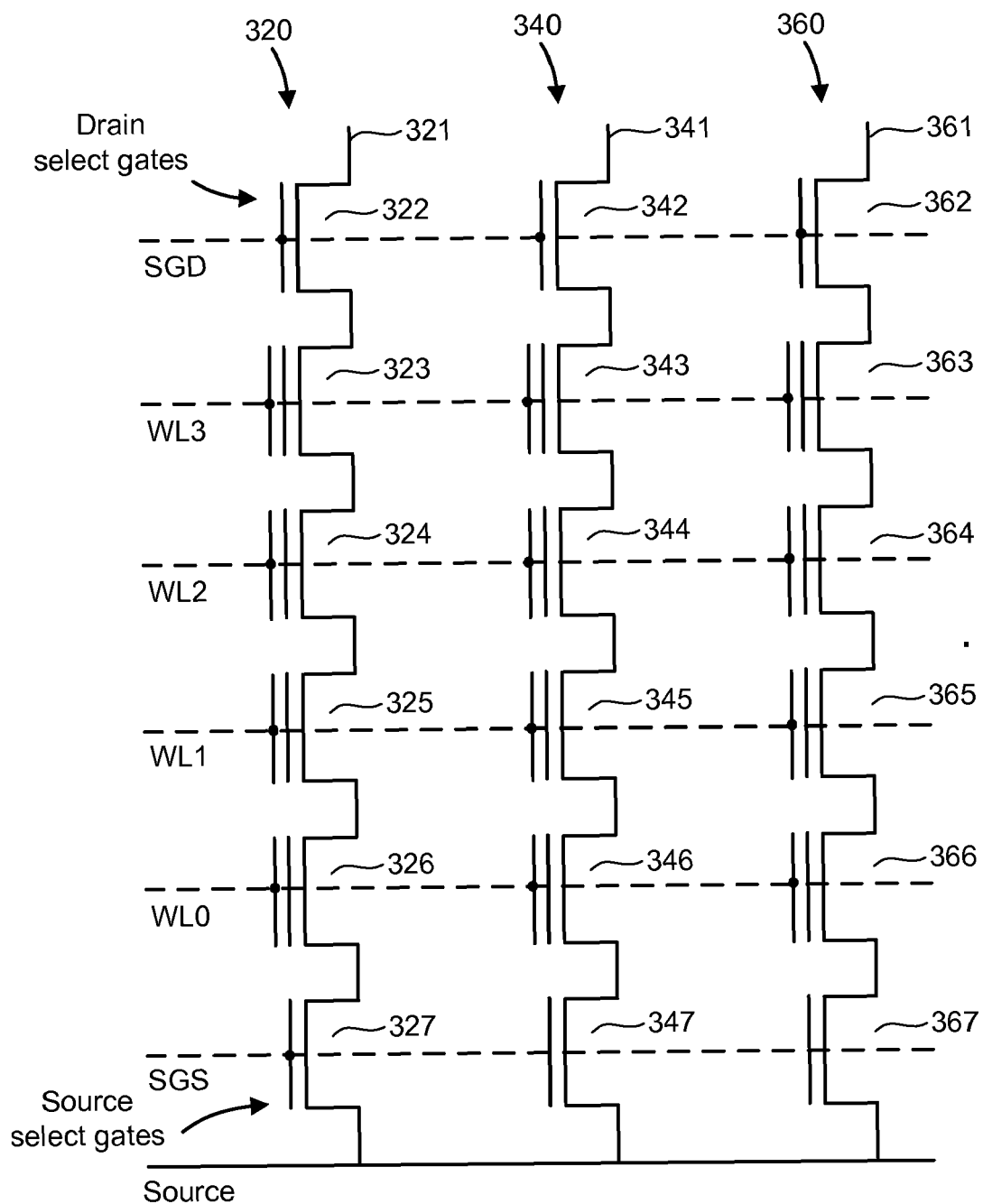
FIG. 1c is a block diagram of an array of NAND flash storage elements.

FIG. 1c is a circuit diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gates and four storage elements. While four storage elements are illustrated for simplicity, modern NAND strings can have up to thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, and so forth. These select transistors are controlled by a drain select line SGD. In other embodiments, the select lines do not necessarily need to be in common among the NAND strings; that is, different select lines can be provided for different NAND strings. WL3 is connected to the control gates for storage elements 323, 343 and 363. WL2 is connected to the control gates for storage elements 324, 344 and 364. WL1 is connected to the control gates for storage elements 325, 345 and 365. WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, WL2 provides the control gates for storage elements 324, 344 and 364. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the $V_{TH}$ ranges of the storage element depends upon the data encoding scheme adopted for the storage elements.

When programming a flash storage element, a program voltage is applied to the control gate of the storage element, and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 1c, the program voltage will also be applied to the control gates of storage elements 344 and 364.

FIG. 2 depicts a cross-sectional view of a NAND string. The view is simplified and not to scale. The NAND string 200 includes a source-side select gate 206, a drain-side select gate 224, and eight storage elements 208, 210, 212, 214, 216, 218, 220 and 222, formed on a substrate 290. The components can be formed on a p-well region 292 which itself is formed in an n-well region 294 of the substrate. The n-well can in turn be formed in a p-substrate 296. Supply lines 202 and 203 may communicate with the p-well region 292 and n-well region 294, respectively. A source supply line 204 with a potential of $V_{SOURCE}$ is provided in addition to a bit line 226 with a potential of $V_{BL}$. $V_{SGS}$ is applied to the select gate 206 and $V_{SGD}$ is applied to the select gate 224. The source side of a word line or non-volatile storage element refers to the side which faces the source end of the NAND string, e.g., at source supply line 204, while the drain side of a word line or non-volatile storage element refers to the side which faces the drain end of the NAND string, e.g., at bit line 226. In one approach, programming proceeds word line-by-word line, starting at WL0.

As mentioned at the outset, it is important to be able to accurately program data into the storage elements in a memory device. Generally, as non-volatile memory devices such as NAND devices have been shrunk down to smaller and smaller dimensions, the spacing between neighboring storage element is also shrinking. This leads to larger capacitive coupling, which means larger interference from neighboring storage elements. Capacitive coupling includes bit line-to-bit line coupling and word line-to-word line coupling. In a typical all-bit line programming scheme, all storage elements on a given word line WLn are programmed to respective states followed by programming on the next word line, WLn+1. In such a programming scheme, the $V_{TH}$ distributions for the WLn storage elements widen due to interference from storage elements which are bit line neighbors, word line neighbors and diagonal neighbors. Among these effects, the interference effect due to word line adjacent storage elements can be the largest contributor to $V_{TH}$ widening. The interference effect due to bit line adjacent storage elements can be reduced with the use of all bit line programming schemes.

Moreover, in a typical even-odd bit line programming scheme, even numbered storage elements on a given word line WLn are programmed to respective states followed by programming odd numbered storage elements on WLn. Next, even storage elements on WLn+1 are programmed followed by programming odd storage elements on WLn+1, and so forth. Also, odd and even storage elements can be programmed together but verified separately, as discussed in connection with FIG. 4b. In even-odd bit line programming, $V_{TH}$ distributions for the WLn storage elements can similarly widen at least due to interference from storage elements which are word line neighbors.

In order to make the $V_{TH}$ distribution narrower, the interference effects have to be compensated. Some possible approaches use multi-pass programming in which the storage elements are programmed to an offset level below their final intended states in one pass and subsequently programmed the remainder of the way to their final intended states in another pass. The partly programmed state may be considered to be an initial or "foggy" state and the finally programmed state may be considered to be a "fine" or final state. One example multi-pass programming technique is discussed next.

FIG. 3 depicts a programming order for a set of storage elements and associated word lines. Here, a set of storage elements, each represented by a square, is in communication with a set of word lines WLn−1 to WLn+4 and a set of bit lines BLi−1 to BLi+1. The components depicted may be a subset of a much larger set of storage elements, word lines and bit lines. The circled numbers depict a programming order, including a first programming pass in a left hand column and a second programming pass in a right hand column. Note that a first or second pass denotes an order with respect to a given word line. A first programming pass is performed for selected storage elements associated with WLn−1 (see circled "1") and then for selected storage elements associated with WLn (see circled "2"). A second programming pass is then performed for WLn−1 (see circled "3"). A first programming pass is then performed for WLn+1 (see circled "4"). A second programming pass is then performed for WLn (see circled "5"). The process proceeds accordingly until the storage elements of the last word line have been programmed using both first and second passes. This programming order may be referred to as a word line look ahead or zigzag sequence.

Optionally, an additional, initial programming pass may be performed before the first and second programming passes depicted such as discussed in connection with FIG. 6a-c.

As mentioned, all bit line programming may be used in which the storage elements of all bit lines on a word line are programmed without regard to whether the storage elements are associated with an even or odd numbered bit line. However, other approaches are possible, including an approach in which the even bit lines are programmed, undergoing program and verify operations, followed by the odd bit lines being programmed, undergoing program and verify operations. In another approach, the even and odd bit lines are both programmed together, receiving a program pulse, after which the even bit lines are verified, and after which the odd bit line are verified. A next program pulse is subsequently applied and the process proceeds accordingly.

Figure 4A:
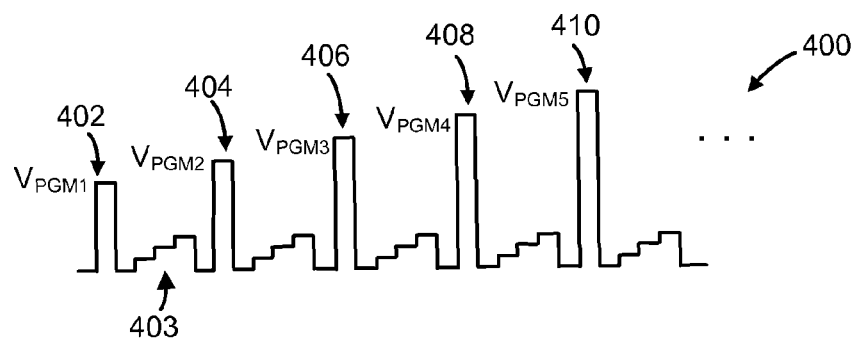
FIG. 4a depicts a first example pulse train applied to the control gates of storage elements during programming.

FIG. 4a depicts a first example pulse train 400 applied to the control gates of storage elements during programming. The pulse train includes program pulses 402, 404, 406, 408, 410 . . . which step up in amplitude, and a set of verify pulses between each program pulse, including example verify pulses 403, such as $V_{VA-PW1}$, $V_{VB-PW1}$ and $V_{VC-PW1}$ or $V_{VA-PW2}$, $V_{VB-PW2}$ and $V_{VC-PW2}$, discussed further below. The pulse amplitudes are $V_{PGM1}$, $V_{PGM2}$, and so forth. The pulses can be fixed in amplitude, or they can step up at a fixed or varying rate, for instance. Typically, m-1 verify pulses are used when m data states are used. In one approach, the same pulse train is used for each programming pass. However, it is also possible to use a different pulse train in the different programming passes. For example, the second programming pass may use a pulse train which starts at a higher initial $V_{PGM}$ than the first pass.

In one embodiment, the programming pulses have a voltage, $V_{PGM1}$, which starts at 12 V and increases by increments, e.g., 0.5 V, for each successive programming pulse until a maximum of, e.g., 20-25 V is reached. In some embodiments, there can be a verify pulse for each state that data is being programmed into, e.g., state A, B and C. In other embodiments, there can be more or fewer verify pulses.

The pulse train 400 may be used during all bit line programming, for instance, or during even-odd programming. During one type of even-odd programming, storage elements of even-numbered bit lines are programmed and verified using repeated applications of the pulse train 400, followed by storage elements of odd-numbered bit lines being programmed and verified using repeated applications of the pulse train 400.

Figure 4B:
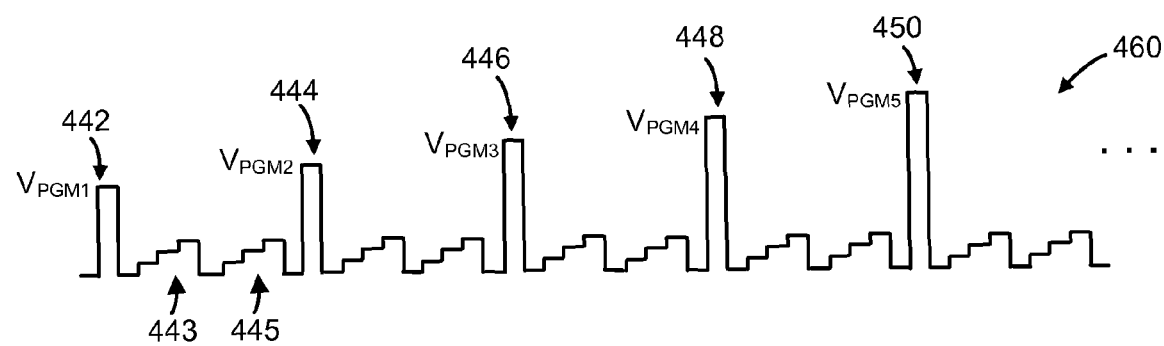
FIG. 4b depicts a second example pulse train applied to the control gates of storage elements during programming.

In another type of even-odd programming, shown in FIG. 4b, storage elements of even- and odd-numbered bit lines are programmed together, but the verify is performed separately. For example, the pulse train 460 includes program pulses 442, 444, 446, 448, 450 . . . which step up in amplitude, and two sets of verify pulses between each program pulse, including example sets 443 and 445. Between program pulses 442 and 444, for instance, the set of verify pulses 443 may be used to verify storage elements of even-numbered bit lines, and the set of verify pulses 445 may be used to verify storage elements of odd-numbered bit lines, in one possible approach.

Figure 5A:
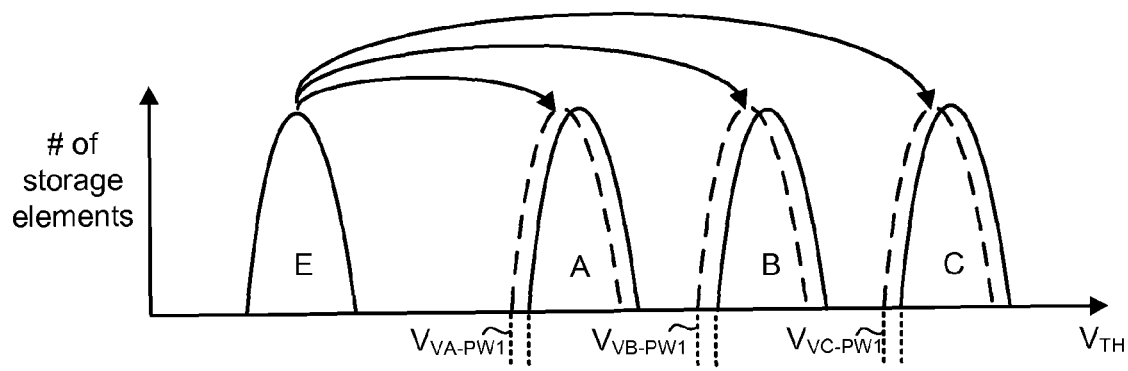
FIG. 5a depicts a first part of a first programming technique in which lower verify voltages are used.

FIG. 5a depicts a first part of a first programming technique, referred to as full sequence programming, in which lower verify voltages are used. As an example, there are four data states, including an erased state (E) and three higher states A, B and C. Any number of states can be used, including two, four, eight, sixteen or more. The storage elements are initially in the E state. A first programming pass uses a first, lower set of verify voltages $V_{VA-PW1}$, $V_{VB-PW1}$, and $V_{VC-PW1}$ for states A, B and C, respectively. PW1 denotes a first pass of a multiple "pass write" (PW) programming process. After the first programming pass, the storage elements which are associated with a given word line, for instance, have $V_{TH}$ distributions which are represented by the dashed lines. In particular, the storage elements are programmed to a level which is offset lower than the final level for each state.

Figure 5B:
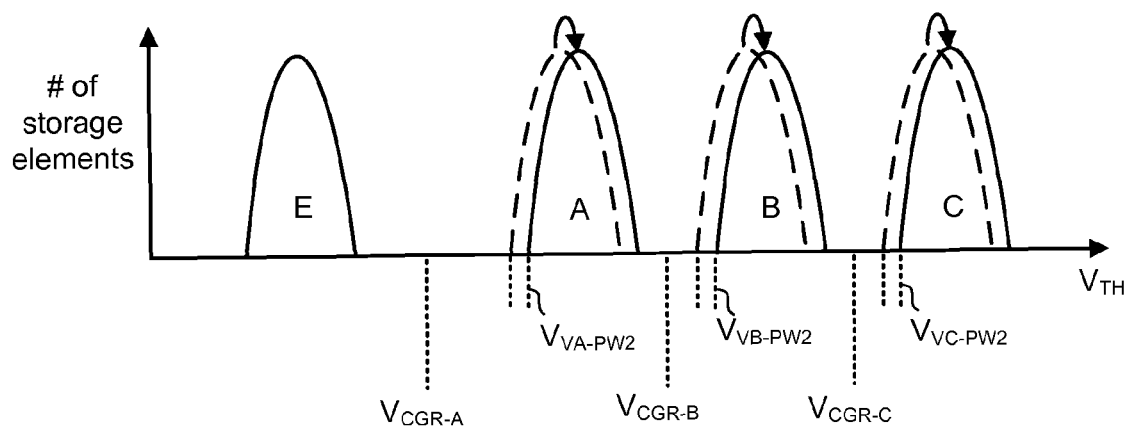
FIG. 5b depicts a second part of a first programming technique in which higher verify voltages are used.

FIG. 5b depicts a second part of a first programming technique in which higher verify voltages are used. The second programming pass, which follows the first pass of FIG. 5a, uses a second, higher set of verify voltages $V_{VA-PW2}$, $V_{VB-PW2}$, and $V_{VC-PW2}$ for states A, B and C, respectively. PW2 denotes a second pass of the multiple "pass write" (PW) programming process. After the second programming pass, the storage elements have $V_{TH}$ distributions which are represented by the solid lines. In particular, the storage elements have been programmed to their final intended states. Thus, each nth verify voltage in the second set of verify voltages is higher than each nth verify voltage in the first set of verify voltages.

Figure 6A:
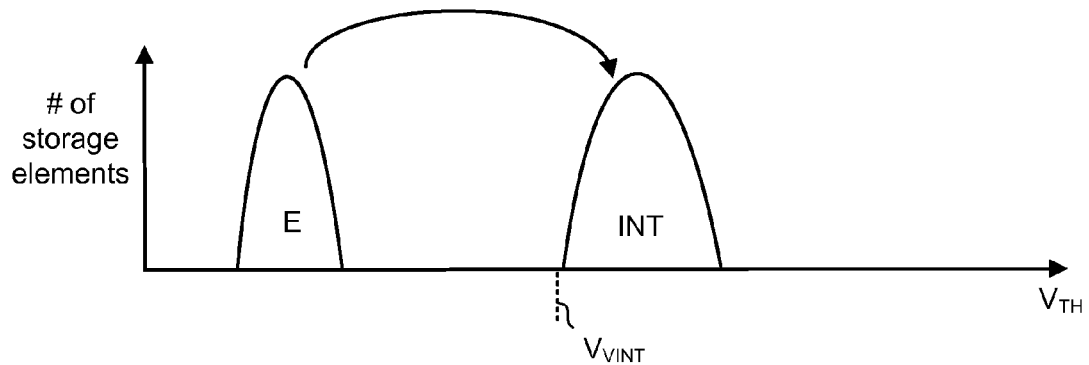
FIG. 6a depicts a first part of a second programming technique in which an intermediate verify voltage is used.

FIG. 6a depicts a first part of a second programming technique in which an intermediate (INT) verify voltage is used. Here, the programming process occurs in three phases. An initial phase involves programming using $V_{VINT}$ for storage elements which are intended to be programmed to a final state of B or C. Storage elements which are intended to be programmed to a final state of A remain in the erased state. This initial phase may involve programming a lower page of data.

Figure 6B:
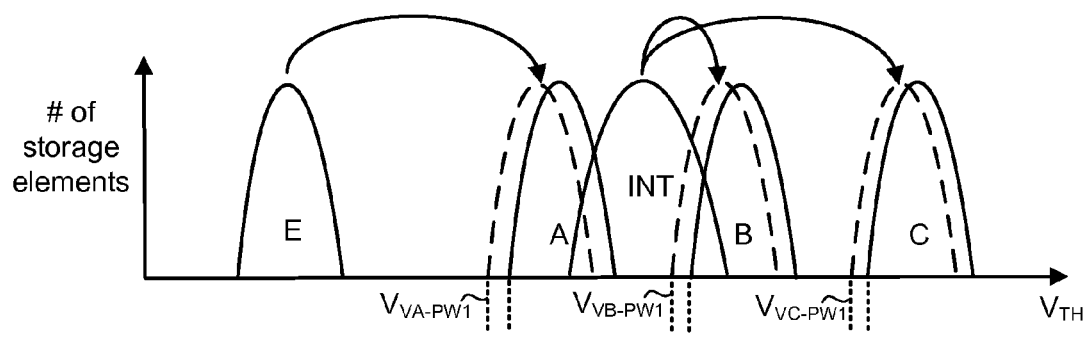
FIG. 6b depicts a second part of a second programming technique in which lower verify voltages are used.

FIG. 6b depicts a second part of a second programming technique in which lower verify voltages are used. After the initial phase of FIG. 6a, a first "pass write" programming pass uses the first, lower set of verify voltages $V_{VA-PW1}$, $V_{VB-PW1}$, and $V_{VC-PW1}$ for states A, B and C, respectively. Storage elements which are intended to be programmed to a final state A are programmed starting from state E, and storage elements which are intended to be programmed to a final state B or C are programmed starting from state INT. As in FIG. 5a, the storage elements are programmed to a level which is offset lower than the final state. This programming phase may be a first pass of programming an upper page of data.

Figure 6C:
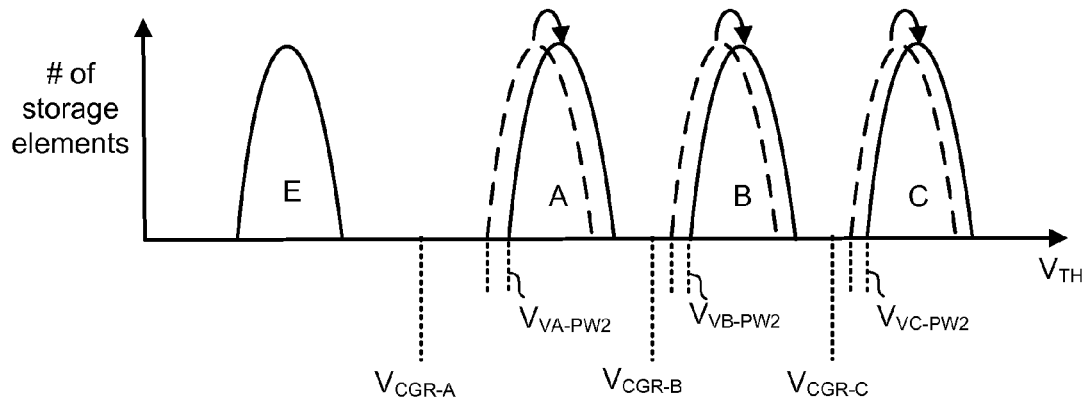
FIG. 6c depicts a third part of a second programming technique in which higher verify voltages are used.

FIG. 6c depicts a third part of a second programming technique in which higher verify voltages are used. After the first "pass write" programming pass of FIG. 6b, a second "pass write" programming pass uses the second, higher set of verify voltages $V_{VA-PW2}$, $V_{VB-PW2}$, and $V_{VC-PW2}$ for states A, B and C, respectively. Storage elements which are intended to be programmed to a final state A, B or C, represented by the solid lines, are programmed starting from the respective lower offset states, represented by the dashed lines. Example control gate read voltages $V_{CGR-A}$, $V_{CGR-B}$ and $V_{GCR-C}$ for states A, B and C, respectively, are also depicted for reference. This programming phase may be a second pass of programming an upper page of data. Further details of an example multi-pass programming technique are discussed next.

In one example implementation, the non-volatile storage elements store two bits of data per storage element, using four data states. For example, assume that state E is the erased state and states A, B and C are the programmed states. State E stores data 11. State A stores data 01. State B stores data 10. State C stores data 00. This is an example of non-Gray coding because both bits change between adjacent states A and B. Other encodings of data to physical data states can also be used. Each storage element stores two pages of data. For reference purposes, these pages of data will be called upper page and lower page; however, they can be given other labels. With reference to state A, the upper page stores bit 0 and the lower page stores bit 1. With reference to state B, the upper page stores bit 1 and the lower page stores bit 0. With reference to state C, both pages store bit data 0.

In an initial programming pass, the lower page is programmed. If the lower page is to remain data 1, then the storage element state remains at state E. If the data is to be programmed to 0, then the threshold of voltage of the storage element is raised such that the storage element is programmed to state INT. In one embodiment, after a storage element is programmed from state E to state INT, its neighbor storage element (WLn+1) in the NAND string will then be programmed with respect to its lower page. For example, looking back at FIG. 1b, after the lower page for storage element 106 is programmed, the lower page for storage element 104 would be programmed. After programming storage element 104, the floating gate to floating gate coupling effect will raise the apparent $V_{TH}$ of storage element 106 if storage element 104 had a $V_{TH}$ raised from state E to state INT. This will have the effect of widening the $V_{TH}$ distribution for state INT. This apparent widening of the $V_{TH}$ distribution will be mostly remedied when programming the upper page.

If the storage element is in state E and the upper page is to remain at 1, then the storage element will remain in state E. If the storage element is in state E and its upper page data is to be programmed to 0, then the $V_{TH}$ of the storage element will be raised so that the storage element is in state A. If the storage element was in the INT threshold voltage distribution and the upper page data is to remain at 1, then the storage element will be programmed to final state B. If the storage element is the INT threshold voltage distribution and the upper page data is to become data 0, then the $V_{TH}$ of the storage element will be raised so that the storage element is in state C. An example of an alternate state coding is to move from distribution INT to state C when the upper page data is a 1, and to move to state B when the upper page data is a 0.

Although FIGS. 6a-c provide an example with respect to four data states and two pages of data, the concepts taught can be applied to other implementations with any number of states and pages.

Figure 6D:
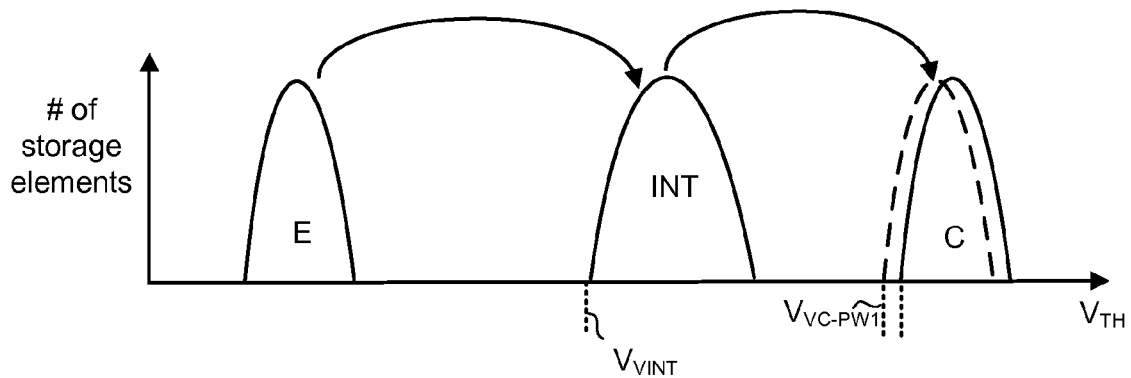
FIG. 6d depicts a first part of a third programming technique in which an intermediate verify voltage and a lower verify voltage for the C state are used.
Figure 6E:
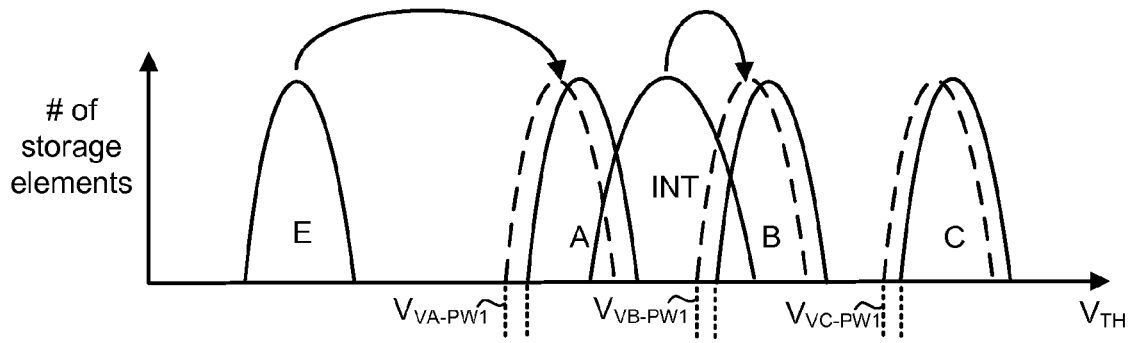
FIG. 6e depicts a second part of a third programming technique in which lower verify voltages for A and B states are used.
Figure 6F:
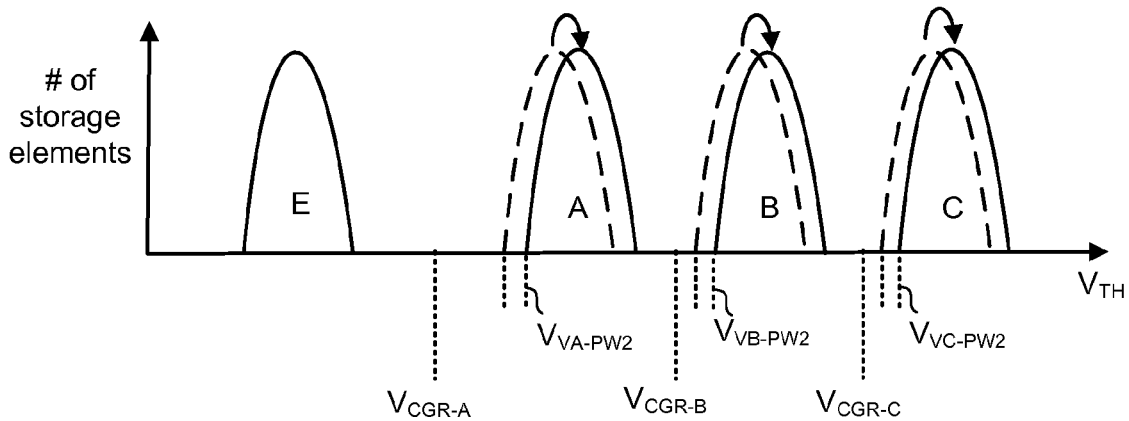
FIG. 6f depicts a third part of a second programming technique in which higher verify voltages are used.

A further programming option is discussed next. FIG. 6d depicts a first part of a third programming technique in which an intermediate verify voltage and a lower verify voltage for the C state are used, FIG. 6e depicts a second part of a third programming technique in which lower verify voltages for A and B states are used, and FIG. 6f depicts a third part of a second programming technique in which higher verify voltages are used. This option can also reduce the impact of disturbs and neighbor-cell interference effects. It mainly reduces bit line-to-bit line interference and program disturb. One example of such a programming technique is "C-first," where the C state represents the highest state in a four data state, multi-level implementation. The technique can be extended to eight, sixteen or other numbers of states. Such techniques involve programming all of the highest state cells to their intended state before programming lower state cells to their intended states. Typically, two or more passes are performed, where a sequence of program pulses is repeated in each programming pass. For example, a step-wise increasing sequence of program pulses may be applied in each pass.

In an initial programming pass (FIG. 6d), B state storage elements are programmed using $V_{VINT}$ as a verify level, and C state storage elements are programmed using $V_{VC-PW1}$ as a verify level. The B and C state storage elements thus reach the distribution INT at which time the B state storage elements are locked out from further programming while the C state storage elements continue to be programmed higher. In a next programming pass of FIG. 6e, the A and B state storage elements are programmed using the lower verify levels $V_{VA-PW1}$ and $V_{VB-PW1}$, respectively. The C state storage elements are locked out from programming at this time, in one possible approach. In a next programming pass of FIG. 6f, the A, B and C state storage elements are programmed using the higher verify levels $V_{VA-PW2}$, $V_{VB-PW2}$ and $V_{VC-PW2}$, respectively.

Figure 7A:
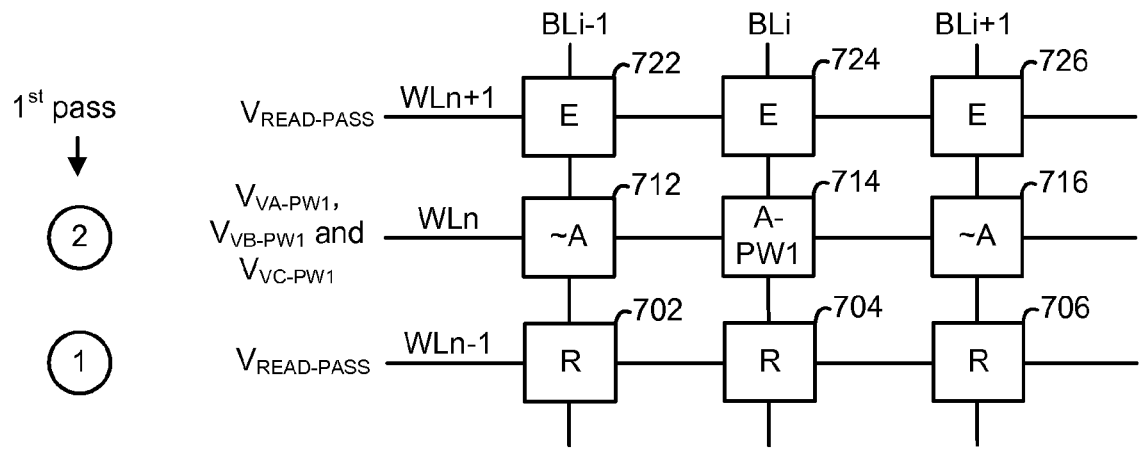
FIGS. 7a-7c depict a set of storage elements during an all bit line programming operation.
Figure 7B:
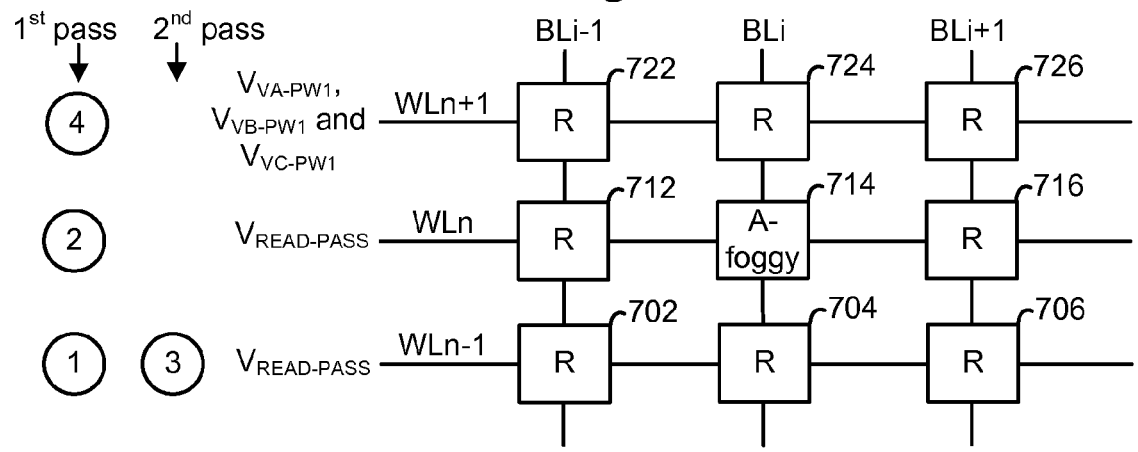
Figure 7C:
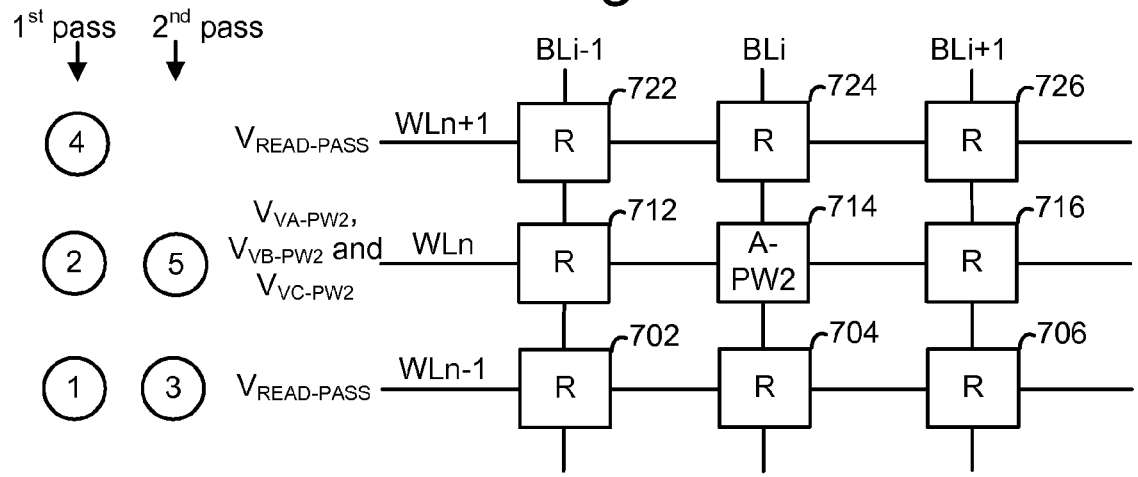

An example sequence of programming proceeds from FIG. 7a-7c for an all bit line operation. The components depicted may be a subset of a much larger set of storage elements, word lines and bit lines. In an all bit line programming operation, for a selected word line, the storage elements of all bit lines can be programmed together.

In FIG. 7a, storage elements on WLn−1, e.g., storage elements 702, 704 and 706, are programmed in a first programming pass toward states "R", representing any randomly selected state. Their states are not important to coupling on WLn. This step is represented by the circled "1." Next, referring to the circled "2", storage elements on WLn, e.g., storage elements 712, 714 and 716, are programmed in a first programming pass. This pass can correspond to FIG. 5a, 6b or 6e, for instance. Storage elements 712 and 716 are programmed to state "~A", indicating that they are at state A currently but may subsequently reach a higher state, and storage element 714 is programmed to state "A-PW1", representing state A based on its lower verify level, $V_{VA-PW1}$. As an illustration, storage element 714 is programmed to state A as a target. In this example, when a word line is selected for programming, verify operations occur after each program pulse, as discussed previously in connection with FIG. 4. During the verify operations on WLn, one or more verify voltages of a lower set of verify voltages, represented by $V_{VA-PW1}$, $V_{VB-PW1}$ and $V_{VC-PW1}$ are applied to WLn and a nominal pass voltage represented by $V_{READ-PASS}$ is applied to the remaining word lines including WLn−1 and WLn+1. The pass voltage is used to turn on (make conductive) the unselected storage elements so that a sensing operation can occur for the selected word line. On WLn+1, storage elements 722, 724 and 726 are in the E state since they have not yet been programmed.

Figure 8A:
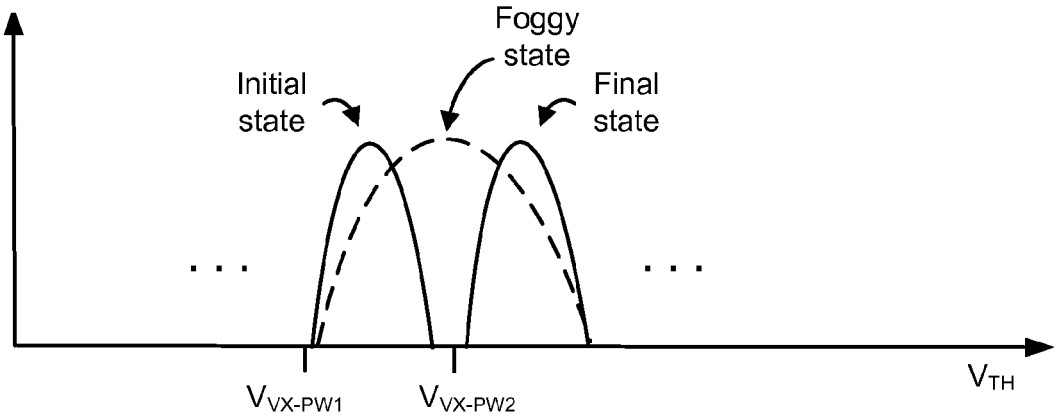
FIG. 8a depicts threshold voltage distributions for an example state during programming.

At this point, the $V_{TH}$ distribution is relatively narrow, as shown by the initial state in FIG. 8a. FIG. 8a depicts $V_{TH}$ distributions for an example state "X" during programming, e.g., where X is the A, B or C state. The x-axis denotes the $V_{TH}$ of storage elements on a selected word line for an example target state X. Not all states are indicated. The y-axis denotes a number of storage elements for a corresponding $V_{TH}$. The $V_{TH}$ of each storage element is programmed just past $V_{VX-PW1}$ for each target state X.

Next, referring to FIG. 7b and the circled "3", storage elements on WLn–1 are programmed in a second programming pass to their respective states "R". Next, referring to the circled "4", storage elements on WLn+1 are programmed in a first programming pass toward their respective states "R". At this time, $V_{VA-PW1}$, $V_{VB-PW1}$ and $V_{VC-PW1}$ are applied to WLn+1 and $V_{READ-PASS}$ is applied to the remaining word lines, including WLn–1 and WLn. Due to the programming on WLn+1, the storage elements on WLn are affected by coupling which tends to raise and widen their $V_{TH}$ distribution for each state, so that the $V_{TH}$ distribution is in a "foggy" or widened state (FIG. 8a) for each target state. For example, in FIG. 7b, storage element 714 is in an "A-Foggy" state. Storage elements 712 and 716 can be in any state.

Next, referring to FIG. 7c and the circled "5", the storage elements on WLn are programmed in a second programming pass to their final respective states using a second, higher set of verify voltages including, e.g., $V_{VA-PW2}$, $V_{VB-PW2}$ and $V_{VC-PW2}$. This pass can correspond to FIG. 5b, 6c or 6f, for instance. Storage element 714 thus is raised to a state A-PW2 which represents the final A state. At this point, the $V_{TH}$ distribution is again relatively narrow, as shown by the final state in FIG. 8a. As indicated, the $V_{TH}$ of each selected storage element on WLn is programmed just above $V_{VX-PW2}$ for each target state X.

During odd-even programming, for a selected word line, the storage elements on the even numbered bit lines can be programmed and verified separately from the storage elements on the odd numbered bit lines, or programmed at the same time but verified separately. FIGS. 7d-7h describe an even-odd programming operation in which the storage elements on the even numbered bit lines are programmed and verified separately from the storage elements on the odd numbered bit lines, as an example. Additionally, the program operation includes an initial pass in which a lower page is programmed, a first pass of programming an upper page, and a second pass of programming the upper page, as discussed in connection with FIGS. 6a-6c.

In FIG. 7d, storage element 704 on the even bit line BLi on WLn–1 has been programmed in the initial pass toward some state R, after which storage elements 702 and 706 on the odd bit lines BLi–1 and BLi+1, respectively, for WLn–1 have been programmed in the initial pass toward some state R, as represented by the circled "1." Additionally, storage element 714 on the even bit line BLi on WLn is being programmed in the initial pass, as represented by the circled "2." In this example, we assume storage element 714 is to be programmed to a target state A, so it remains in the E state during the initial pass (since only storage elements which are to be programmed to the higher B and C states are programmed in the initial pass). During verify operations for WLn, $V_{INT}$ is applied to WLn and $V_{READ-PASS}$ is applied to the other word lines.

In FIG. 7e, storage elements 712 and 716 on the odd bit lines BLi–1 and BLi+1, respectively, on WLn are being programmed, also as represented by the circled "2." In this example, we assume storage elements 712 and 716 are to be programmed to target states B and C, respectively, so they are programmed to the INT state during the initial pass. Again, during verify operations for WLn, $V_{INT}$ is applied to WLn and $V_{READ-PASS}$ is applied to the other word lines.

In FIG. 7f, storage element 704 on the even bit line BLi on WLn–1 has been programmed in the first pass toward some state R, after which storage elements 702 and 706 on the odd bit lines BLi–1 and BLi+1, for WLn–1 have been programmed in the first pass toward some state R, as represented by the circled "3." Subsequently, storage element 724 on the even bit line BLi on WLn+1 has been programmed in the initial pass toward some state R, after which storage elements 722 and 726 on the odd bit lines BLi–1 and BLi+1, for WLn+1 have been programmed in the initial pass toward some state R, as represented by the circled "4." Subsequently, storage element 714 on the even bit line BLi on WLn is programmed in the first pass to state A-PW1, after which storage elements 712 and 716 on the odd bit lines BLi–1 and BLi+1, for WLn are programmed in the first pass toward states B-PW1 and C-PW1, respectively, as represented by the circled "5." During verify operations for WLn, $V_{VA-PW1}$, $V_{VB-PW1}$ and $V_{VC-PW1}$ are applied to WLn and $V_{READ-PASS}$ is applied to the other word lines.

Figure 7G:
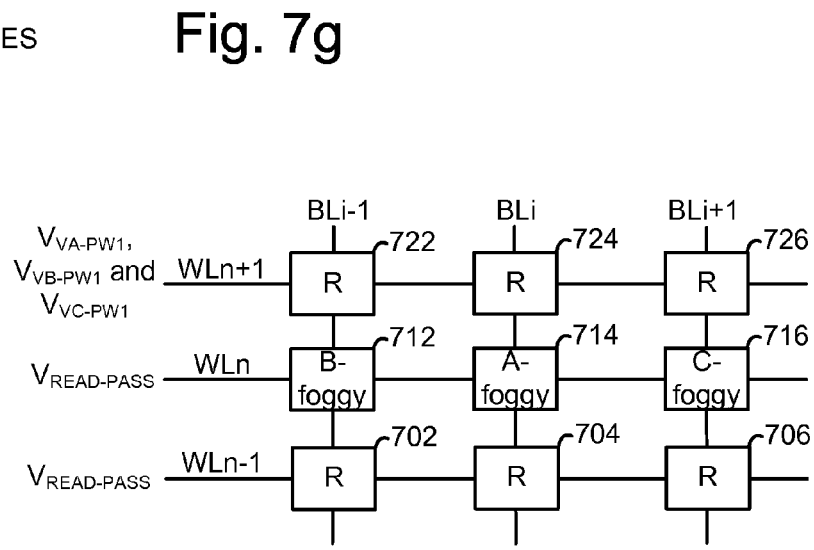

In FIG. 7g, a storage element (not shown) on the even bit line BLi on WLn+2 (not shown) has been programmed in the initial pass toward some state R, after which storage elements on the odd bit lines BLi–1 and BLi+1, for WLn+2 have been programmed in the initial pass toward some state R, as would be represented by a circled "7" if WLn+2 was shown. Subsequently, storage element 724 on the even bit line BLi on WLn+1 is been programmed in the first pass toward some state R, after which storage elements 722 and 726 on the odd bit lines BLi–1 and BLi+1, for WLn+1 are programmed in the first pass toward some state R, as represented by the circled "8." This programming results in capacitive coupling to the storage elements on WLn, resulting in storage elements 712, 714 and 716 transitioning to B-foggy, A-foggy and C-foggy states, respectively. During verify operations for WLn+1, $V_{VA-PW1}$, $V_{VB-PW1}$ and $V_{VC-PW1}$ are applied to WLn+1 and $V_{READ-PASS}$ is applied to the other word lines.

Figure 7H:
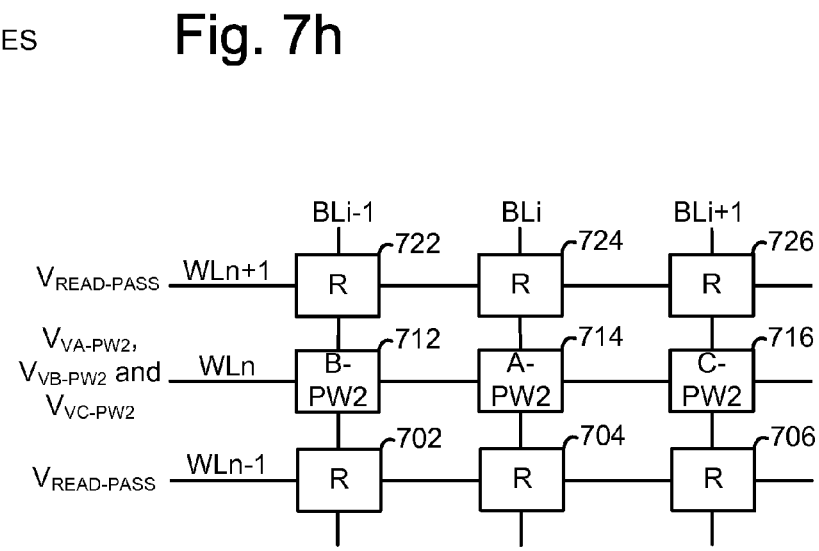

In FIG. 7h, storage element 714 on the even bit line BLi on WLn is programmed in the second pass to A-PW2, its final intended state, after which storage elements 712 and 716 on the odd bit lines BLi–1 and BLi+1, for WLn are programmed in the second pass to B-PW2 and C-PW2, respectively, their final intended states, as represented by the circled "9." During verify operations for WLn, $V_{VA-PW2}$, $V_{VB-PW2}$ and $V_{VC-PW2}$ are applied to WLn and $V_{READ-PASS}$ is applied to the other word lines.

In either the all bit line or even-odd programming approaches, most of the interference effects are nullified by the second programming pass. Further, although WLn+1 is programmed again next in a second programming pass, the amount of coupling which WLn experiences as a result is relatively small since the threshold voltages of the storage elements on WLn+1 are raised a relatively small amount in the second programming pass compared to the first programming pass. In this example, during the verify operations of the second programming pass on WLn, when the higher set of verify voltages are applied to WLn, the same nominal pass voltage as in the first programming pass, represented by $V_{READ-PASS}$, is applied to the remaining word lines including WLn–1 and WLn+1.

During programming, a program pulse ($V_{PGM}$) which is applied to a storage element will increase the threshold voltage ($V_{TH}$) of the storage element by an amount which is a function of the $V_{PGM}$ and the initial $V_{TH}$ of that storage element. A higher $V_{PGM}$ leads to higher $V_{TH}$ increases or jumps while a higher initial $V_{TH}$ leads to smaller $V_{TH}$ increases or jumps. Thus, for a program pulse with a given $V_{PGM}$, storage elements having a higher $V_{TH}$ will have a slower increase or jump than storage elements having a lower $V_{TH}$. Further, during the second programming pass (PW2), since the storage elements have been programmed to a certain $V_{TH}$ level during the first programming pass (PW1), the program pulses result in a smaller increase in the $V_{TH}$ of the storage element. The $V_{TH}$ of the storage elements moves much slower than the $V_{PGM}$ step size, which makes the $V_{TH}$ distribution narrower. This effect is referred to as the pass write effect. Thus, the two-pass programming method makes the final $V_{TH}$ distribution narrower because of compensation of interference effects as well as due to the pass write effect.

In such a multi-pass programming scheme, a critical parameter is the verify level difference used for PW1 and PW2. For a given word line, there is an optimum verify level difference ($\Delta V_{VX}$) between the PW1 verify levels and the PW2 verify levels at which the final $V_{TH}$ distribution will be the narrowest. In one approach, $\Delta V_{VX} = V_{VX-PW2} - V_{VX-PW1}$, so that the same difference is used for each state. However, it is also possible for $\Delta V_{VX}$ to be tailored to different states or sets of states.

Figure 8B:
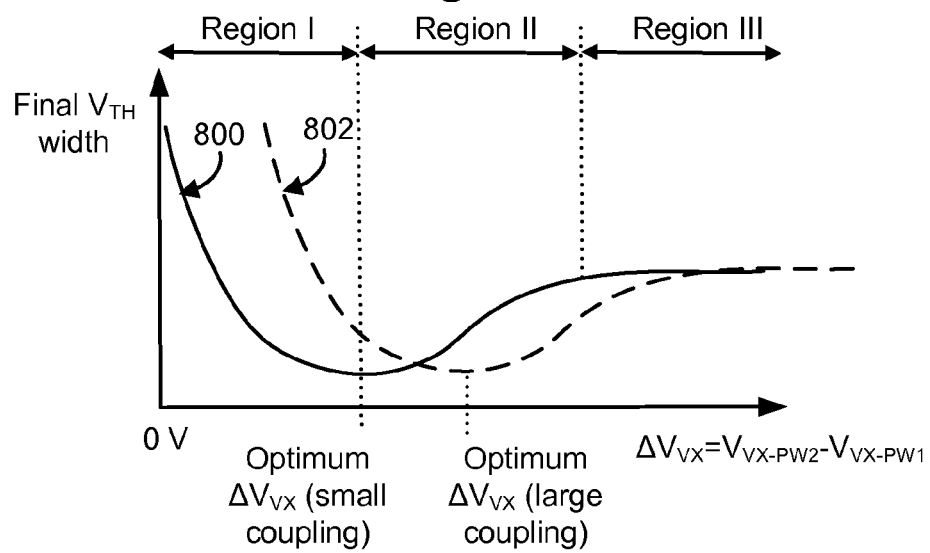
FIG. 8b depicts a graph showing an optimum delta in verify voltages between different programming passes, for large and small coupling devices.

FIG. 8b depicts a graph showing an optimum delta in verify voltages between different programming passes, for large and small coupling devices. The x-axis depicts $\Delta V_{VX}$ and the y-axis depicts the final $V_{TH}$ distribution width, after programming is completed. Further, two curves are shown: a solid curve 800 depicts a relationship for a memory device with a relatively small amount of coupling and a dashed curve 802 depicts a relationship for a memory device with a relatively large amount of coupling. Each curve includes a minimum at which the $V_{TH}$ distribution width is a minimum. The corresponding $\Delta V_{VX}$ is the optimum. Generally, the amount of capacitive coupling which is experienced during programming can vary for different memory devices and for different storage elements or sets of storage elements, e.g., in a word line or block, due to manufacturing variations, the number of programming cycles experienced, age and other factors.

Each curve has three regions. Regions I, II and III are depicted for curve 800. In region I, $\Delta V_{VX}$ is less than the optimum. In other words, the PW2 verify level ($V_{VX-PW2}$) is very close to the PW1 verify level ($V_{VX-PW1}$). In this case, most of the storage elements are locked out from further programming within the first few programming pulses and, hence, their $V_{TH}$ does not increase significantly. An increase in $V_{TH}$ is experienced only for the storage elements whose $V_{TH}$ falls between PW1 verify and PW2 verify. Thus, the overall $V_{TH}$ distribution still remains quite wide. As the PW2 verify level increases (and thus $\Delta V_{VX}$ increases), more and more storage elements have their $V_{TH}$ fall between PW1 verify and PW2 verify and, hence, more storage elements experience the PW effect. Thus the overall $V_{TH}$ distribution narrows, up to a point at which the optimum $\Delta V_{VX}$ is reached. At the optimum $\Delta V_{VX}$, a majority of the storage elements experience the PW effect which causes the $V_{TH}$ width to be a minimum.

In region II, $\Delta V_{VX}$ is greater than the optimum, and the final $V_{TH}$ distribution width varies with $\Delta V_{VX}$. As $\Delta V_{VX}$ is increased above the optimum, some storage elements (mainly the storage elements which were close to the lower-tail of the foggy state distribution) start to lose the pass write effect and start to experience relatively large increases in $V_{TH}$ with each program pulse. These storage elements reach steady state and hence their $V_{TH}$ increases at the same rate as the $V_{PGM}$ step size. This causes the $V_{TH}$ distribution to start to widen again.

In region III, $\Delta V_{VX}$ reaches a point at which the final $V_{TH}$ distribution width is essentially constant even as $\Delta V_{VX}$ increases. By the time the storage elements reach the PW2 verify level, almost all of them lose the PW effect and reach the steady state. Then, they step up at the same rate as the $V_{PGM}$ step size. Thus, the $V_{TH}$ distribution ends up being wider than if the majority of storage elements receive the PW effect, which happens at the optimum $\Delta V_{VX}$.

Figure 8C:
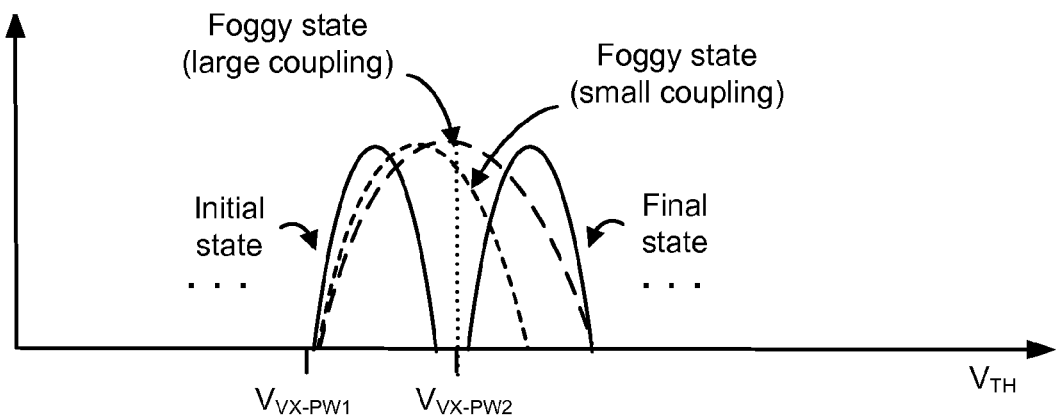
FIG. 8c depicts threshold voltage distributions for an example state during programming, for large and small coupling devices.

FIG. 8c depicts threshold voltage distributions for an example state during programming, for large and small coupling devices. The short and long dashed lines depict the foggy state for a memory device with a small or large amount of coupling, respectively. The optimum $\Delta V_{VX}$ is a function of the $V_{TH}$ width of the foggy state. If the foggy state is relatively wider, then the optimum $\Delta V_{VX}$ is relatively higher. For a narrow foggy state, the optimum $\Delta_{VVX}$ is relatively lower. The optimum PW2 verify level, $V_{VX-PW2}$, is chosen typically near the center of the foggy $V_{TH}$ distribution. The level of $V_{VX-PW2}$ which is depicted is optimum for a device with a large amount of coupling. Thus, if the foggy state $V_{TH}$ distribution is wider, the optimum PW2 verify level will also be higher since the center of the foggy $V_{TH}$ distribution, where $V_{VX-PW2}$, is chosen, moves to the right along the $V_{TH}$ axis.

The width of the foggy state $V_{TH}$ distribution depends on the amount of interference from the neighboring storage elements. For a device with higher coupling (e.g., word line-to-word line, bit line-to-bit line, or diagonal-to-diagonal couplings), the $V_{TH}$ of a selected storage element will be more affected by the $V_{TH}$ states on the neighboring storage elements and hence result in more coupling. For such a device, the foggy state $V_{TH}$ distribution will be much wider than for a device that shows smaller coupling effects. As a result, the optimum $\Delta V_{VX}$ will also be different for these two devices. A device with lower couplings will tend to have a lower optimum $\Delta V_{VX}$ than a device with higher couplings.

In mass production, there can be a significant variation in coupling from lot to lot or unit to unit. Even within one unit, different word lines or blocks can possibly have a different amount of coupling. Thus, the optimum $\Delta V_{VX}$ can vary from lot to lot, device to device, word line to word line and so forth. Thus, using the same $\Delta V_{VX}$ on each memory device would not lead to the narrowest $V_{TH}$ distribution on all devices. A technique for optimizing the $\Delta_{VVX}$ for each device dynamically using word line coupling is provided herein. In this technique, the difference between optimum $\Delta V_{VX}$ levels from device to device can be made much smaller so that the same $\Delta V_{VX}$ can be used on each memory device, while still managing to obtain narrow final $V_{TH}$ distributions. The technique does not require the verify voltages or the $\Delta V_{VX}$ level to be trimmed for each device. Or, if different $\Delta V_{VX}$ levels are used for different states, for instance, the same levels can be used on each memory device for a given state.

As mentioned above, the use of fixed verify levels can lead to a constant $\Delta V_{VX}$ on each memory device which might or might not be optimal. This approach can lead to wider $V_{TH}$ distributions on some devices. In contrast, techniques provided herein can reduce the difference between optimum PW-verify levels for different devices, enabling the use the same $\Delta V_{VX}$ for each device while still achieving close to optimal $V_{TH}$ distributions.

A technique provided herein use the word line coupling effect to create an effective additional offset between PW1 verify and PW2 verify which varies with the coupling, so that the effect is higher when the coupling is higher. As discussed, for a device with higher coupling, the optimum $\Delta_{VVX}$ is larger. Thus, such an extra offset helps us to reach the optimum level. The word line coupling effect is used by applying a different voltage bias to on WLn+1 during a program-verify operation on WLn for the first programming pass (PW1) versus the second programming pass (PW2).

Figure 9A:
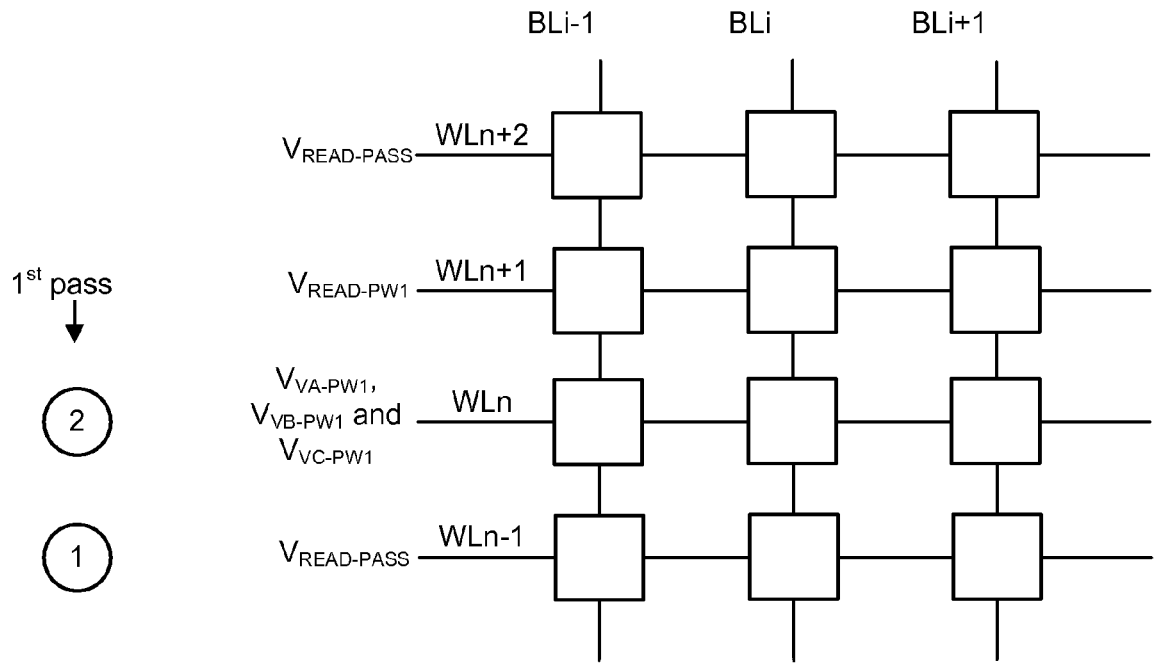
FIG. 9a depicts a set of storage elements during a first programming pass on WLn, where a lower pass voltage is provided on WLn+1.

FIG. 9a depicts a set of storage elements during a first programming pass on WLn, where a lower pass voltage is provided on WLn+1. The components depicted may be a subset of a much larger set of storage elements, word lines and bit lines. In an example programming sequence, a first programming pass, denoted by the circled "1" is performed on the storage elements of WLn−1. Next, a first programming pass, denoted by the circled "2" is performed on the storage elements of WLn. During the programming on WLn, verify operations are performed in which lower verify voltages such as $V_{VA-PW1}$, $V_{VB-PW1}$ and $V_{VC-PW1}$ are applied to WLn while, at the same time, a corresponding lower pass voltage $V_{READ-PW1}$ is applied to WLn+1. A nominal pass voltage $V_{READ-PASS}$ may be applied to the remaining word lines including WLn−1 and WLn+2.

Figure 9B:
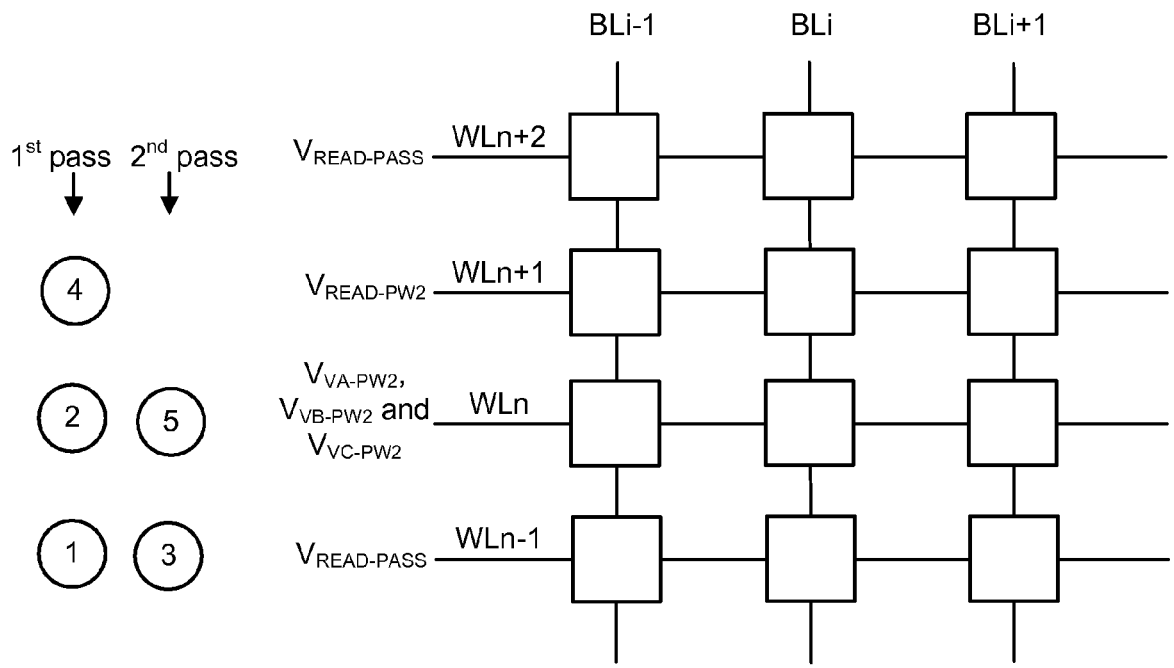
FIG. 9b depicts a set of storage elements during a second programming pass on WLn, where a higher pass voltage is provided on WLn+1.

FIG. 9b depicts a set of storage elements during a second programming pass on WLn, where a higher pass voltage is provided on WLn+1. Continuing the example programming sequence of FIG. 9a, a second programming pass, denoted by the circled "3" is performed on the storage elements of WLn−1. Next, a first programming pass, denoted by the circled "4" is performed on the storage elements of WLn+1. Next, a second programming pass, denoted by the circled "5" is performed on the storage elements of WLn. During the programming on WLn, verify operations are performed in which higher verify voltages such as $V_{VA-PW2}$, $V_{VB-PW2}$ and $V_{VC-PW2}$ are applied to WLn while, at the same time, a corresponding higher pass voltage $V_{READ-PW2}$ is applied to WLn+1. The nominal pass voltage $V_{READ-PASS}$ may again be applied to the remaining word lines including WLn−1 and WLn+2

Note that the programming sequence depicted is one possible example, as other examples are possible. Generally, the techniques provided are most useful when multi-pass programming is used. Further, as mentioned previously, the first and second programming passes which are depicted may occur after an initial program pass such as to an intermediate state, in which case three programming passes are used. Moreover, the coupling on WLn due to WLn+1 occurs because WLn+1 is programmed before WLn is fully programmed. WLn+1 is after WLn in a programming sequence, in this example.

In summary, during PW1 verify on WLn, we use $V_{READ-PW1}$ on WLn+1 and during PW2 verify on WLn, we use $V_{READ-PW2}$ on WLn+1, where $V_{READ-PW1} < V_{READ-PW2}$. Moreover, we may also set $V_{READ-PW2} = V_{READ-PASS}$, the nominal or default voltage bias for unselected word lines during read and program verify. In another approach, $V_{READ-PW2} > V_{READ-PASS}$. In an example implementation, $V_{READ-PW1}$ is about 3 V and $V_{READ-PW2}$ is about 6-8 V. An optimum value for $V_{READ-PW1}$ can be set based on testing or theoretical calculations. $V_{READ-PW1}$ can be about 1/3-2/3 of $V_{READ-PW2}$, such as about 1/2 of $V_{READ-PW2}$. Generally, the maximum value of $V_{READ-PW1}$ or $V_{READ-PASS}$ is limited so that programming of the unselected storage elements is avoided.

Using a different voltage bias on WLn+1 for PW1 verify versus PW2 verify causes the apparent $V_{TH}$ of the storage elements on WLn to shift between PW1 and PW2. The $V_{TH}$ of a storage element on WLn appears to be higher during PW1 verify than during PW2 verify. This causes an additional difference in the effective PW1 and PW2 verify levels. A larger difference is created for a device having higher coupling. This tends to automatically reduce variations in the optimum $\Delta V_{VX}$ level between devices having higher and lower coupling from WLn+1, so that all devices effectively have an optimum $\Delta V_{VX}$.

FIG. 9c depicts a set of storage elements during a first programming pass on WLn, where a lower pass voltage is provided on WLn+1, as an alternative to FIG. 9a. Here, an initial program pass of a lower page is performed before first and second programming passes of an upper page.

FIG. 9d depicts a set of storage elements during a second programming pass on WLn, where a higher pass voltage is provided on WLn+1, as an alternative to FIG. 9b. As in FIG. 9c, an initial program pass of a lower page is performed before first and second programming passes of an upper page.

Figure 10A:
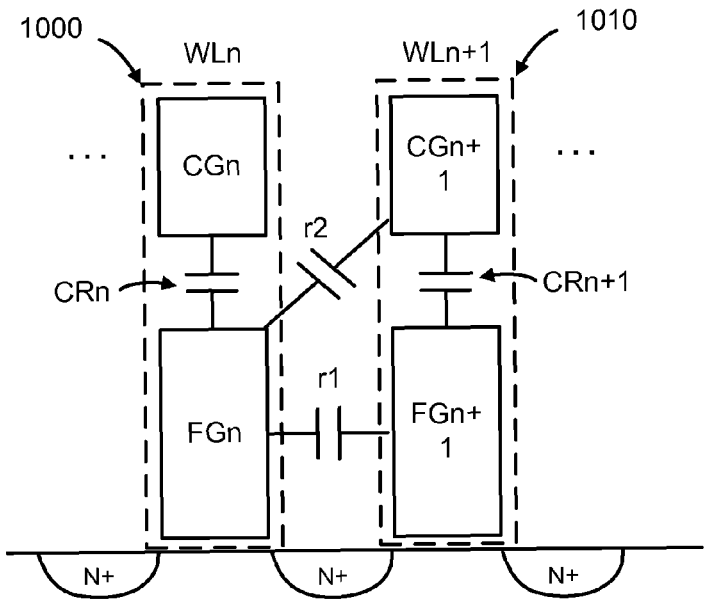
FIG. 10a depicts coupling of storage elements during programming from WLn+1 to WLn in a cross-sectional view in a bit line direction.

FIG. 10a depicts coupling of storage elements during programming from WLn+1 to WLn in a cross-sectional view in a bit line direction. Example storage elements 1000 and 1010 are depicted. Each has a control gate above a floating gate. For example, storage element 1000 includes control gate CGn above a floating gate FGn, and storage element 1010 includes control gate CGn+1 above a floating gate FGn+1.

By using a different WLn+1 voltage bias, or pass voltage, during PW1 verify versus PW2 verify, the apparent $V_{TH}$ of the storage element on WLn is different for PW1 versus PW2 verify. In particular, when a lower WLn+1 pass voltage is used, the apparent $V_{TH}$ of a storage element on WLn appears to be higher due to control gate-to-floating gate coupling. On the other hand, when WLn+1 is biased higher, the same control gate-to-floating gate coupling raises the potential of FGn and hence helps to turn on the storage element, thus making its $V_{TH}$ appear to be lower. Typically, WLn+1 to FGn coupling scales with FGn to FGn+1 coupling, which allows the technique to be effective with different generations of memory devices which are scaled to different dimensions.

Generally, when a storage element is sensed, a determination is made as to whether the storage element is in a conductive state when each of the verify voltages is applied to the control gate of the storage element via the selected word line, for instance. The storage element will be conductive, e.g., turn on, if the verify voltage exceeds the $V_{TH}$ of the storage element.

In FIG. 10a, Crn is a coupling ratio of CGn to FGn, Crn+1 is a coupling ratio of CGn+1 to FGn+1, where $Cr = C_{FG-CG}/C_{FG(TOTAL)}$, r1 is a coupling ratio of FGn+1 to FGn, where $r1 = C_{FG-FG}/C_{FG(TOTAL)}$ and, r2 is a coupling ratio of CGn+1 to FGn, where $r2 = C_{CG-FG}/C_{FG(TOTAL)}$. The notation Cx-y denotes capacitance between x and y. Thus, $C_{FG-CG}$ represents capacitance between a floating gate (FG) and a control gate (CG), and $C_{FG-FG}$ represents capacitance between an FG and another FG. With $V_{READ-PW1} < V_{READ-PW2}$, the $V_{TH}$ of the storage elements of WLn appear to be higher during PW1 than during PW2. The PW1 verify level is effectively lower than a level at which it is externally set. This can be described as follows:

If $V_{READ-PW1} = V_{READ-PW2}$, Effective $\Delta V_{VX} = (V_{VX-PW2} - V_{VX-PW1})$ (1)

If $V_{READ-PW1} < V_{READ-PW2}$, Effective $\Delta V_{VX} = (V_{VX-PW2} - V_{VX-PW1}) + (V_{READ-PW2} - V_{READ-PW1}) * (r2 + r1*Crn+1)/Crn$. (2)

Thus, by using case (2), we incorporate r1 in determining $\Delta V_{VX}$. The same factor (r1) is responsible for $V_{TH}$ widening due to neighbor interference or coupling. The impact of the above equations is described below in connection with FIG. 10b.

Figure 10B:
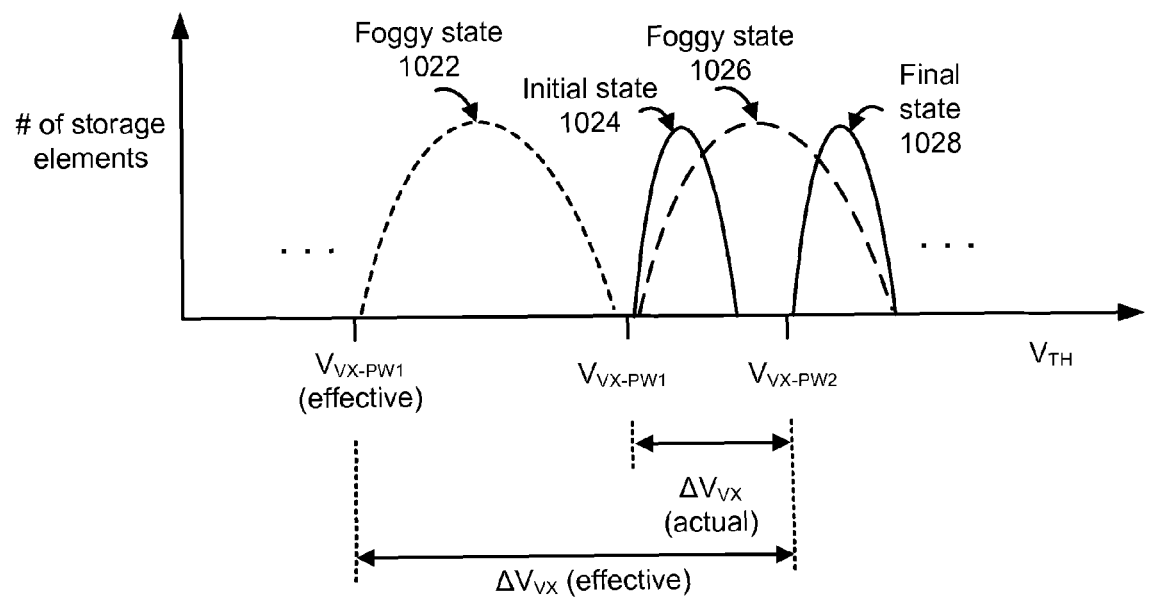
FIG. 10b depicts effective and actual threshold voltage distributions for an example state on WLn during programming, based on different pass voltages on WLn+1.

FIG. 10b depicts different $V_{TH}$ distributions for an example state on WLn during programming, based on different pass voltages on WLn+1. The x-axis denotes the $V_{TH}$ for an example target state X. Not all states are indicated. The y-axis denotes a number of storage elements for a corresponding $V_{TH}$. $V_{TH}$ distributions are depicted for a case where a lower pass voltage ($V_{READ-PW1}$) on WLn+1 is used in a first programming pass, and for a case where a higher pass voltage ($V_{READ-PW2}$) on WLn+1 is used in the first programming pass.

In particular, a $V_{TH}$ distribution 1024 represents an initial state which is reached after a first programming pass when a lower pass voltage is used on WLn+1 than is the second programming pass. The foggy state 1026 is subsequently realized due to coupling caused when WLn+1 is programmed in its first programming pass. Also, the $V_{TH}$ distribution 1028 of the final state which is reached after the second programming pass is depicted. A foggy state $V_{TH}$ distribution 1022 is reached after a first programming pass when a higher pass voltage is used on WLn+1. This foggy state is effectively shifted down by using a higher $V_{READ-PW2}$ on WLn+1. The final state 1028 is subsequently reached after the second programming pass on WLn. What this indicates is that coupling causes the effective foggy state to shift lower which, in turn, increases the effective $V_{VX}$.

By using $V_{READ-PW1} < V_{READ-PW2}$ (instead of them being equal), the effective $V_{VX-PW1}$ is shifted down. Thus, the effective $\Delta V_{VX}$ is made higher than $\Delta V_{VX}$ that is externally set. Higher coupling devices will have a higher effective $\Delta V_{VX}$ than lower coupling devices. Thus, with the same $\Delta V_{VX}$ (actual) setting, we still manage to obtain an effective $\Delta V_{VX}$ that is close to the respective optimum $\Delta V_{VX}$ value for devices with different amounts of coupling. As a result, narrow $V_{TH}$ distributions and high programming accuracy can be realized for memory devices with different amounts of coupling.

Note that the above approach can be used with other coupling compensation techniques such as bit line-to-bit line coupling compensation techniques.

FIG. 11 depicts an example programming process. A programming operation begins at step 1100. At step 1105 an index i is initialized to zero. Step 1110 includes programming WLi using the intermediate verify voltage, $V_{VINT}$, on the selected word line and using a nominal pass voltage, $V_{READ-PASS}$, on the unselected word lines. See, e.g., FIGS. 6a-6c. This is optional as some programming schemes do not use this initial pass, as mentioned. If i>0 at decision step 1115, step 1120 includes programming WLi-1 using the lower verify voltages, $V_{VX-PW1}$ while applying a lower pass voltage, $V_{READ-PW1}$, on the adjacent higher word line WLi. If i>1 at decision step 1125, step 1130 includes programming WLi-2 using the higher verify voltages, $V_{VX-PW2}$, while applying the higher pass voltage, $V_{READ-PW2}$, on the adjacent higher word line WLi-1 and while applying the nominal pass voltage, $V_{READ-PASS}$, on the remaining unselected word lines. The index i is incremented at step 1135.

Decision step 1115 is false when i=0, and decision step 1125 is false when i=1, in which case the process continues at step 1135.

Decision step 1140 determines if the index i has reached k, where k is the number of word lines, and k−1 is the last or highest word line. For example, with k=64, the word lines are numbered from 0 to 63. If decision step 1140 is false, the process continues at step 1110. If i=k, step 1145 includes programming WLk-1, the highest word line, using the lower verify voltages, $V_{VX-PW1}$, while applying $V_{READ-PASS}$ to the other word lines. There is no higher word line in this case. Step 1150 includes programming WLk-2 using the higher verify voltages, $V_{VX-PW2}$, while applying $V_{READ-PW2}$ to the higher word line WLk-1 and applying $V_{READ-PASS}$ to the other word lines. Step 1155 includes programming WLk-1 using the higher verify voltages, $V_{VX-PW2}$, while applying $V_{READ-PASS}$ to the other word lines.

Figure 12A:
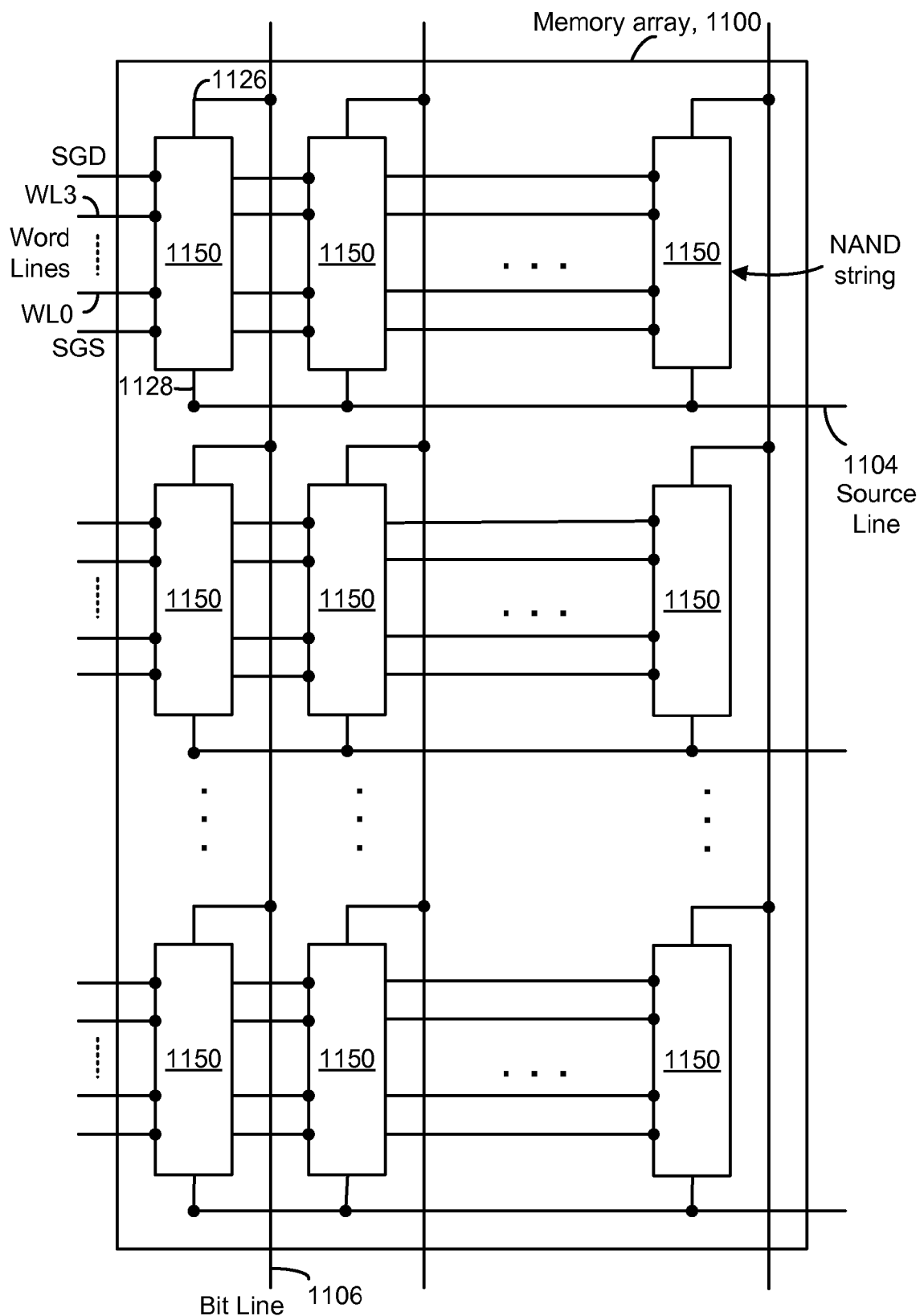
FIG. 12a is a block diagram of an array of NAND flash storage elements.

FIG. 12a illustrates an example of an array 1100 of NAND storage elements, such as those shown in FIGS. 1a and 1b. Along each column, a bit line 1106 is coupled to the drain terminal 1126 of the drain select gate for the NAND string 1150. Along each row of NAND strings, a source line 1104 may connect all the source terminals 1128 of the source select gates of the NAND strings.

The array of storage elements is divided into a large number of blocks of storage elements. As is common for flash EEPROM systems, the block is the unit of erase. That is, each block contains the minimum number of storage elements that are erased together. Each block is typically divided into a number of pages. A page is the smallest unit of programming. One or more pages of data are typically stored in one row of storage elements. For example, a row typically contains several interleaved pages or it may constitute one page. All storage elements of a page will be read or programmed together. Moreover, a page can store user data from one or more sectors. A sector is a logical concept used by the host as a convenient unit of user data; it typically does not contain overhead data, which is confined to the controller. Overhead data may include an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from eight pages, for example, up to 32, 64, 128 or more pages. In some embodiments, a row of NAND strings comprises a block.

Memory storage elements are erased in one embodiment by raising the p-well to an erase voltage (e.g., 14-22 V) for a sufficient period of time and grounding the word lines of a selected block while the source and bit lines are floating. Due to capacitive coupling, the unselected word lines, bit lines, select lines, and c-source are also raised to a significant fraction of the erase voltage. A strong electric field is thus applied to the tunnel oxide layers of selected storage elements and the data of the selected storage elements are erased as electrons of the floating gates are emitted to the substrate side, typically by Fowler-Nordheim tunneling mechanism. As electrons are transferred from the floating gate to the p-well region, the $V_{TH}$ of a selected storage element is lowered. Erasing can be performed on the entire memory array, separate blocks, or another unit of storage elements.

FIG. 12b is a block diagram of a non-volatile memory system using single row/column decoders and read/write circuits. The diagram illustrates a memory device 1296 having read/write circuits for reading and programming a page of storage elements in parallel, according to one embodiment of the present invention. Memory device 1296 may include one or more memory die 1298. Memory die 1298 includes a two-dimensional array of storage elements 1100, control circuitry 1210, and read/write circuits 1265. In some embodiments, the array of storage elements can be three dimensional. The memory array 1100 is addressable by word lines via a row decoder 1230 and by bit lines via a column decoder 1260. The read/write circuits 1265 include multiple sense blocks 1200 and allow a page of storage elements to be read or programmed in parallel. Typically a controller 1250 is included in the same memory device 1296 (e.g., a removable storage card) as the one or more memory die 1298. Commands and Data are transferred between the host and controller 1250 via lines 1220 and between the controller and the one or more memory die 1298 via lines 1218.

The control circuitry 1210 cooperates with the read/write circuits 1265 to perform memory operations on the memory array 1100. The control circuitry 1210 includes a state machine 1212, an on-chip address decoder 1214 and a power control module 1216. The state machine 1212 provides chip-level control of memory operations, and may include an ECC decoding engine. The on-chip address decoder 1214 provides an address interface between that used by the host or a memory controller to the hardware address used by the decoders 1230 and 1260. The power control module 1216 controls the power and voltages supplied to the word lines and bit lines during memory operations.

In some implementations, some of the components of FIG. 12b can be combined. In various designs, one or more of the components (alone or in combination), other than storage element array 1100, can be thought of as a managing circuit. For example, one or more managing circuits may include any one of or a combination of control circuitry 1210, state machine 1212, decoders 1214/1260, power control 1216, sense blocks 1200, read/write circuits 1265, controller 1250, and so forth.

In another approach, the non-volatile memory system uses dual row/column decoders and read/write circuits in which access to the memory array 1100 by the various peripheral circuits is implemented in a symmetric fashion, on opposite sides of the array, so that the densities of access lines and circuitry on each side are reduced by half. Thus, two row decoders, two column decoders, read/write circuits connecting to bit lines from the bottom and read/write circuits connecting to bit lines from the top of the array 1100.

Figure 13:
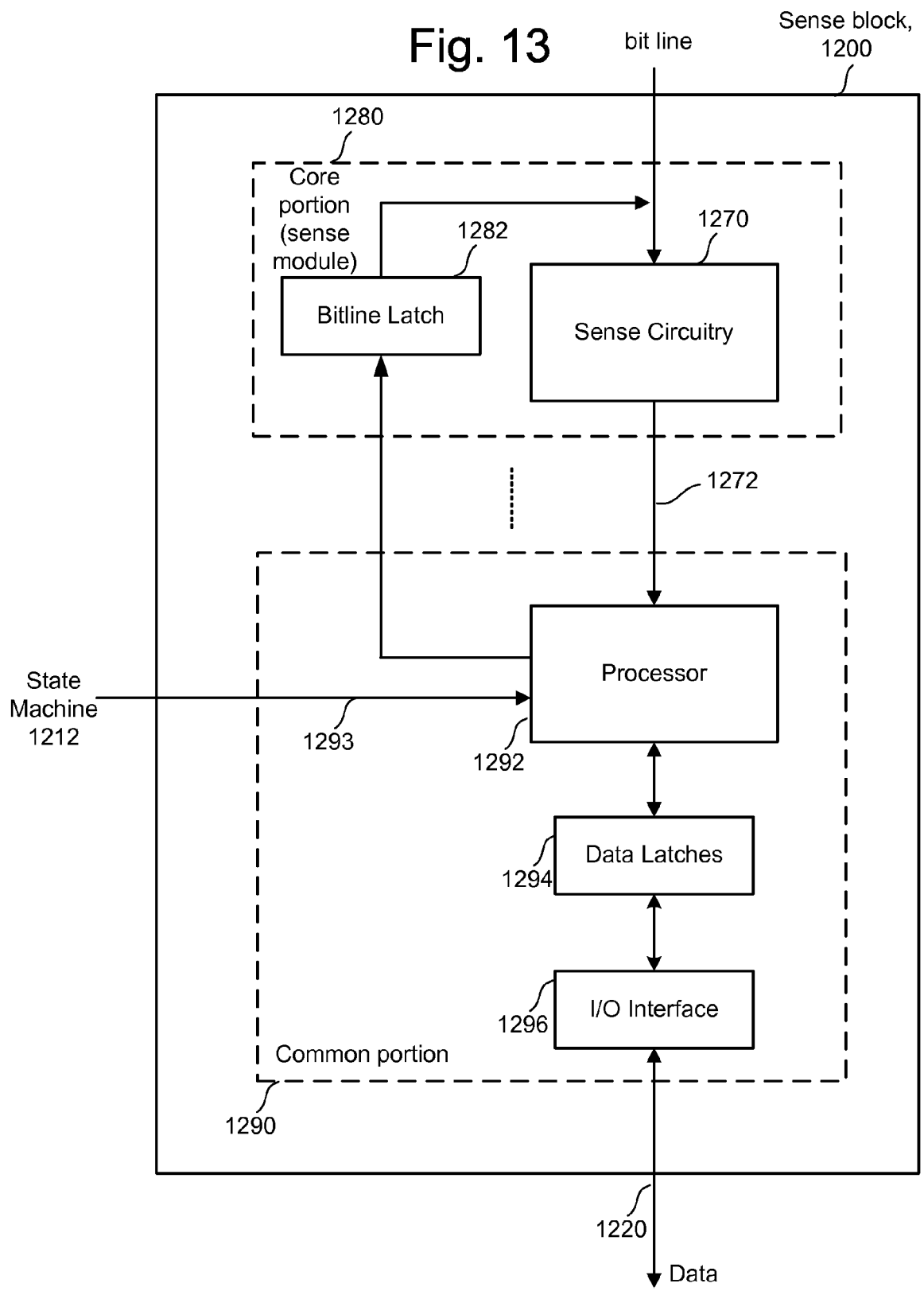
FIG. 13 is a block diagram depicting one embodiment of a sense block.

FIG. 13 is a block diagram depicting one embodiment of a sense block. An individual sense block 1200 is partitioned into a core portion, referred to as a sense module 1280, and a common portion 1290. In one embodiment, there will be a separate sense module 1280 for each bit line and one common portion 1290 for a set of multiple sense modules 1280. In one example, a sense block will include one common portion 1290 and eight sense modules 1280. Each of the sense modules in a group will communicate with the associated common portion via a data bus 1272. For further details refer to U.S. 2006/0140007, titled "Non-Volatile Memory and Method with Shared Processing for an Aggregate of Sense Amplifiers" published Jun. 29, 2006, and incorporated herein by reference in its entirety.

Sense module 1280 comprises sense circuitry 1270 that determines whether a conduction current in a connected bit line is above or below a predetermined threshold level. Sense module 1280 also includes a bit line latch 1282 that is used to set a voltage condition on the connected bit line. For example, a predetermined state latched in bit line latch 1282 will result in the connected bit line being pulled to a state designating program inhibit (e.g., 1.5-3 V).

Common portion 1290 comprises a processor 1292, a set of data latches 1294 and an I/O Interface 1296 coupled between the set of data latches 1294 and data bus 1220. Processor 1292 performs computations. For example, one of its functions is to determine the data stored in the sensed storage element and store the determined data in the set of data latches. The set of data latches 1294 is used to store data bits determined by processor 1292 during a read operation. It is also used to store data bits imported from the data bus 1220 during a program operation. The imported data bits represent write data meant to be programmed into the memory. I/O interface 1296 provides an interface between data latches 1294 and the data bus 1220.

During read or sensing, the operation of the system is under the control of state machine 1212 that controls the supply of different control gate voltages to the addressed storage element. As it steps through the various predefined control gate voltages corresponding to the various memory states supported by the memory, the sense module 1280 may trip at one of these voltages and an output will be provided from sense module 1280 to processor 1292 via bus 1272. At that point, processor 1292 determines the resultant memory state by consideration of the tripping event(s) of the sense module and the information about the applied control gate voltage from the state machine via input lines 1293. It then computes a binary encoding for the memory state and stores the resultant data bits into data latches 1294. In another embodiment of the core portion, bit line latch 1282 serves double duty, both as a latch for latching the output of the sense module 1280 and also as a bit line latch as described above.

It is anticipated that some implementations will include multiple processors 1292. In one embodiment, each processor 1292 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 1292 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 1294 from the data bus 1220. The program operation, under the control of the state machine, comprises a series of programming voltage pulses applied to the control gates of the addressed storage elements. Each programming pulse is followed by a read back (verify) to determine if the storage element has been programmed to the desired memory state. Processor 1292 monitors the read back memory state relative to the desired memory state. When the two are in agreement, the processor 1292 sets the bit line latch 1282 so as to cause the bit line to be pulled to a state designating program inhibit. This inhibits the storage element coupled to the bit line from further programming even if programming pulses appear on its control gate. In other embodiments the processor initially loads the bit line latch 1282 and the sense circuitry sets it to an inhibit value during the verify process.

Data latch stack 1294 contains a stack of data latches corresponding to the sense module. In one embodiment, there are three data latches per sense module 1280. In some implementations (but not required), the data latches are implemented as a shift register so that the parallel data stored therein is converted to serial data for data bus 1220, and vice versa. In the preferred embodiment, all the data latches corresponding to the read/write block of m storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 14:
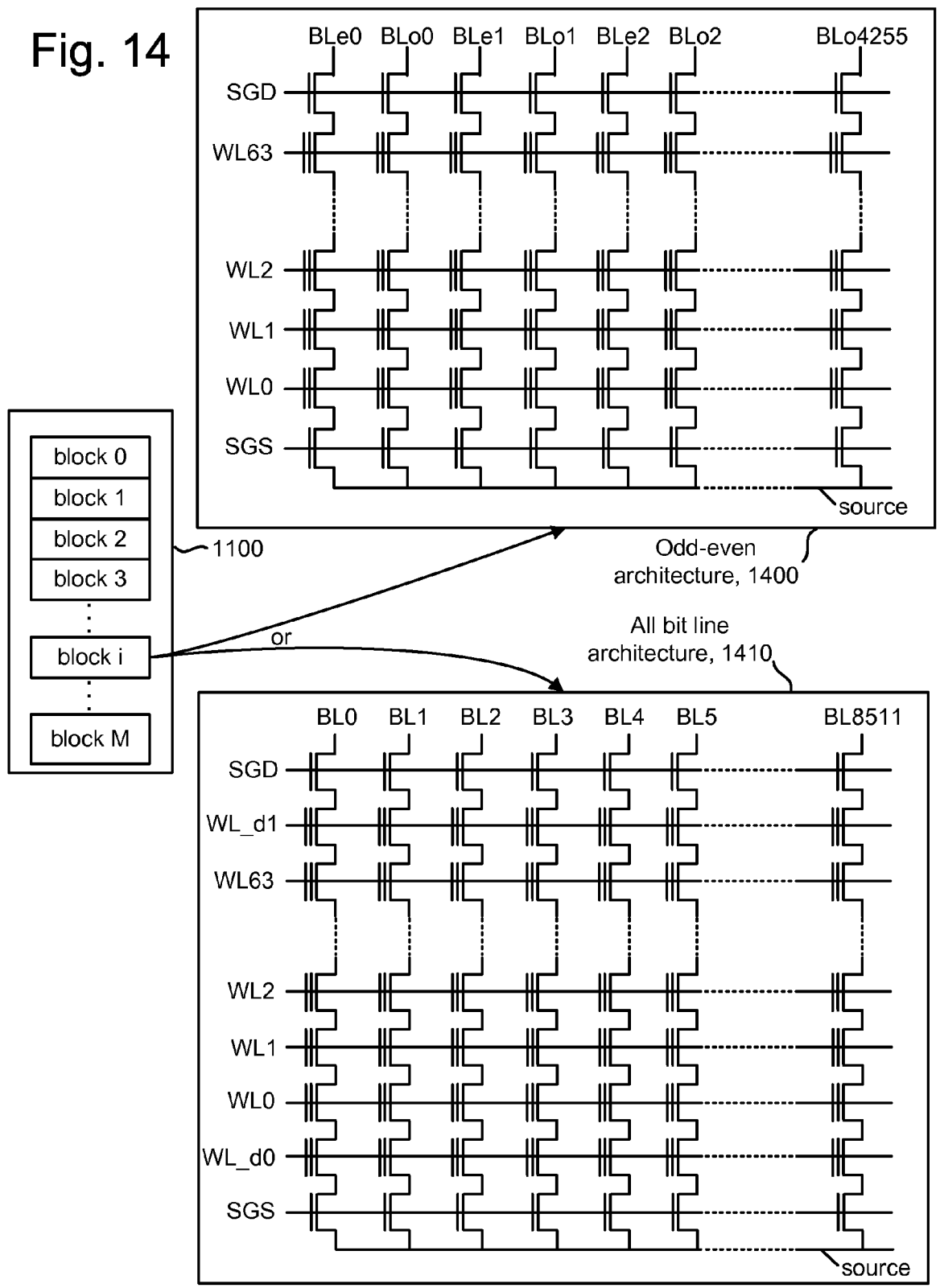
FIG. 14 illustrates an example of an organization of a memory array into blocks for an all bit line memory architecture or for an even-odd memory architecture.

FIG. 14 illustrates an example of an organization of a memory array into blocks for an all bit line memory architecture or for an odd-even memory architecture. Exemplary structures of memory array 1100 are described. As one example, a NAND flash EEPROM is described that is partitioned into 1,024 blocks. The data stored in each block can be simultaneously erased. In one embodiment, the block is the minimum unit of storage elements that are simultaneously erased. In each block, in this example, there are 8,512 columns corresponding to bit lines BL0, BL1, . . . BL8511. In one embodiment referred to as an all bit line (ABL) architecture (architecture 1410), all the bit lines of a block can be simultaneously selected during read and program operations. Storage elements along a common word line and connected to any bit line can be programmed at the same time.

In the example provided, four storage elements are connected in series to form a NAND string. Although four storage elements are shown to be included in each NAND string, more or less than four can be used (e.g., 16, 32, 64 or another number). One terminal of the NAND string is connected to a corresponding bit line via a drain select gate (connected to select gate drain lines SGD), and another terminal is connected to c-source via a source select gate (connected to select gate source line SGS).

In another embodiment, referred to as an odd-even architecture (architecture 1400), the bit lines are divided into even bit lines (BLe) and odd bit lines (BLo). In the odd/even bit line architecture, storage elements along a common word line and connected to the odd bit lines are programmed at one time, while storage elements along a common word line and connected to even bit lines are programmed at another time. In each block, in this example, there are 8,512 columns that are divided into even columns and odd columns. In this example, four storage elements are shown connected in series to form a NAND string. Although four storage elements are shown to be included in each NAND string, more or fewer than four storage elements can be used.

During one configuration of read and programming operations, 4,256 storage elements are simultaneously selected. The storage elements selected have the same word line and the same kind of bit line (e.g., even or odd). Therefore, 532 bytes of data, which form a logical page, can be read or programmed simultaneously, and one block of the memory can store at least eight logical pages (four word lines, each with odd and even pages). For multi-state storage elements, when each storage element stores two bits of data, where each of these two bits are stored in a different page, one block stores sixteen logical pages. Other sized blocks and pages can also be used.

For either the ABL or the odd-even architecture, storage elements can be erased by raising the p-well to an erase voltage (e.g., 20 V) and grounding the word lines of a selected block. The source and bit lines are floating. Erasing can be performed on the entire memory array, separate blocks, or another unit of the storage elements which is a portion of the memory device. Electrons are transferred from the floating gates of the storage elements to the p-well region so that the $V_{TH}$ of the storage elements becomes negative.

In the read and verify operations, the select gates (SGD and SGS) are connected to a voltage in a range of 2.5-4.5 V and the unselected word lines (e.g., WL0, WL1 and WL3, when WL2 is the selected word line) are raised to a read pass voltage, $V_{READ}$, (typically a voltage in the range of 4.5 to 6 V) to make the transistors operate as pass gates. The selected word line WL2 is connected to a voltage, a level of which is specified for each read and verify operation in order to determine whether a $V_{TH}$ of the concerned storage element is above or below such level. For example, in a read operation for a two-level storage element, the selected word line WL2 may be grounded, so that it is detected whether the $V_{TH}$ is higher than 0 V. In a verify operation for a two level storage element, the selected word line WL2 is connected to 0.8 V, for example, so that it is verified whether or not the $V_{TH}$ has reached at least 0.8 V. The source and p-well are at 0 V. The selected bit lines, assumed to be the even bit lines (BLe), are pre-charged to a level of, for example, 0.7 V. If the $V_{TH}$ is higher than the read or verify level on the word line, the potential level of the bit line (BLe) associated with the storage element of interest maintains the high level because of the non-/conductive storage element. On the other hand, if the $V_{TH}$ is lower than the read or verify level, the potential level of the concerned bit line (BLe) decreases to a low level, for example, less than 0.5 V, because the conductive storage element discharges the bit line. The state of the storage element can thereby be detected by a voltage comparator sense amplifier that is connected to the bit line.

The erase, read and verify operations described above are performed according to techniques known in the art. Thus, many of the details explained can be varied by one skilled in the art. Other erase, read and verify techniques known in the art can also be used.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for operating non-volatile storage, comprising:
   (a) performing program and verify operations on a particular storage element in a set of series-connected storage elements to raise a threshold voltage of the particular storage element to a first verify level, and during the verify operations, applying a first pass voltage to an adjacent storage element of the particular storage element in the set of series-connected storage elements;
   (b) subsequently, performing program and verify operations on the adjacent storage element to raise a threshold voltage of the adjacent storage element;
   (c) subsequently, performing further program and verify operations on the particular storage element to raise the threshold voltage of the particular storage element to a second verify level, above the first verify level, and during the further verify operations, applying a second pass voltage, which differs from the first pass voltage, to the adjacent storage element.

2. The method of claim 1, wherein:
   the threshold voltage of the particular storage element is at an erased state at a start of step (a).

3. The method of claim 1, wherein:
the threshold voltage of the particular storage element is at an intermediate level which is below the first verify level and above an erased state at a start of step (a).

4. The method of claim 1, wherein step (b) raises a threshold voltage of the adjacent storage element to the first verify level, the method further comprising:
(d) after step (c), performing further program and verify operations on the adjacent storage element to raise the threshold voltage of the adjacent storage element to the second verify level.

5. The method of claim 1, wherein:
the first pass voltage is lower than the second pass voltage.

6. The method of claim 1, wherein:
the set of series-connected storage elements are provided in a NAND string.

7. The method of claim 1, further comprising:
while applying the first pass voltage to the adjacent storage element in step (a), and while applying the second pass voltage to the adjacent storage element in step (c), applying a same pass voltage to at least one other storage element in the set of storage elements.

8. The method of claim 1, wherein:
the adjacent storage element is after the particular storage element in a programming order.

9. A method for operating non-volatile storage, comprising:
performing one pass of a multi-pass programming process, including alternatingly programming and verifying a particular storage element in a set of series-connected storage elements, the verifying includes applying a first set of verify voltages to the particular storage element while applying a first pass voltage to an adjacent storage element of the particular storage element in the set of series-connected storage elements; and
subsequently, performing another pass of the multi-pass programming process, including alternatingly programming and verifying the particular storage element, the verifying of the another pass includes applying a second set of verify voltages to the particular storage element, the second set of verify voltages differs at least in part from the first set of verify voltages, while applying a second pass voltage, which differs from the first pass voltage, to the adjacent storage element.

10. The method of claim 9, wherein:
the one pass further includes alternatingly programming and verifying the adjacent storage element after the alternatingly programming and verifying the particular storage element, the verifying of the adjacent storage element includes applying the first set of verify voltages to the adjacent storage element.

11. The method of claim 10, wherein:
the another pass further includes alternatingly programming and verifying the adjacent storage element after the alternatingly programming and verifying the particular storage element in the another pass, the verifying of the adjacent storage element in the another pass includes applying the second set of verify voltages to the adjacent storage element.

12. The method of claim 9, wherein:
each nth verify voltage in the second set of verify voltages is higher than each nth verify voltage in the first set of verify voltages.

13. The method of claim 9, wherein:
the first pass voltage is lower than the second pass voltage.

14. The method of claim 9, further comprising:
performing a prior pass of the multi-pass programming process prior to the one pass, including alternatingly programming and verifying the particular storage element, the particular storage element is at an erased state at a start of the prior pass.

15. The method of claim 9, wherein:
the particular storage element is at an intermediate state which is above an erased state at a start of the one pass.

16. A non-volatile storage apparatus, comprising:
a set of series-connected storage elements; and
at least one control circuit, the at least one control circuit: (a) performs program and verify operations on a particular storage element in the set of series-connected storage elements to raise a threshold voltage of the particular storage element to a first verify level, and during the verify operations, applies a first pass voltage to an adjacent storage element of the particular storage element in the set of series-connected storage elements, (b) subsequently performs program and verify operations on the adjacent storage element to raise a threshold voltage of the adjacent storage element, and (c) subsequently performs further program and verify operations on the particular storage element to raise the threshold voltage of the particular storage element to a second verify level, above the first verify level, and during the further verify operations, applies a second pass voltage, which differs from the first pass voltage, to the adjacent storage element.

17. The non-volatile storage apparatus of claim 16, wherein:
the threshold voltage of the particular storage element is at an erased state when the at least one control circuit starts performing program and verify operations on the particular storage element.

18. The non-volatile storage apparatus of claim 16, wherein:
the threshold voltage of the particular storage element is at an intermediate level which is below the first verify level and above an erased state when the at least one control circuit starts performing program and verify operations on the particular storage element.

19. The non-volatile storage apparatus of claim 16, wherein the further programming and verify operations on the particular storage element raise a threshold voltage of the adjacent storage element to the first verify level, and the at least one control circuit, after performing the further program and verify operations on the particular storage element, perform further program and verify operations on the adjacent storage element to raise the threshold voltage of the adjacent storage element to the second verify level.

* * * * *